(12) United States Patent
Hou et al.

(10) Patent No.: US 12,020,991 B2
(45) Date of Patent: Jun. 25, 2024

(54) HIGH-K GATE DIELECTRIC AND METHOD FORMING SAME

(71) Applicant: Taiwan Semiconductor Manufacturing Co., Ltd., Hsinchu (TW)

(72) Inventors: Cheng-Hao Hou, Hsinchu (TW); Che-Hao Chang, Hsinchu (TW); Da-Yuan Lee, Jhubei (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 172 days.

(21) Appl. No.: 17/412,967

(22) Filed: Aug. 26, 2021

(65) Prior Publication Data
US 2023/0069187 A1 Mar. 2, 2023

(51) Int. Cl.
*H01L 21/28* (2006.01)
*H01L 21/8238* (2006.01)
*H01L 27/092* (2006.01)

(52) U.S. Cl.
CPC ........... *H01L 21/823857* (2013.01); *H01L 21/28185* (2013.01); *H01L 21/823842* (2013.01); *H01L 27/092* (2013.01); *H01L 27/0924* (2013.01); *H01L 21/823821* (2013.01)

(58) Field of Classification Search
CPC ..... H01L 21/823828; H01L 21/823842; H01L 21/823857; H01L 27/0922
See application file for complete search history.

(56) References Cited

U.S. PATENT DOCUMENTS

| | | |
|---|---|---|
| 6,790,755 B2 | 9/2004 | Jeon |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,418,897 B1 | 8/2016 | Ching et al. |
| 9,520,482 B1 | 12/2016 | Chang et al. |
| 9,576,814 B2 | 2/2017 | Wu et al. |
| 9,608,116 B2 | 3/2017 | Ching et al. |

(Continued)

FOREIGN PATENT DOCUMENTS

| | | |
|---|---|---|
| CN | 105097546 A | 11/2015 |
| TW | 200302547 A | 8/2003 |

(Continued)

OTHER PUBLICATIONS

ShiCheng et al. "Study on the thermal stability and electrical properties of the high-k dielectrics (ZrO2)x(SiO2)1-x)," Aug. 2009, Science in China Series E: Technological Sciences, vol. 52, No. 8, pp. 2222-2226 (Year: 2009).*

(Continued)

*Primary Examiner* — Bryan R Junge
(74) *Attorney, Agent, or Firm* — Slater Matsil, LLP

(57) ABSTRACT

A method includes depositing a first high-k dielectric layer over a first semiconductor region, performing a first annealing process on the first high-k dielectric layer, depositing a second high-k dielectric layer over the first high-k dielectric layer; and performing a second annealing process on the first high-k dielectric layer and the second high-k dielectric layer.

20 Claims, 31 Drawing Sheets

(56) References Cited

U.S. PATENT DOCUMENTS

| | | | |
|---|---|---|---|
| 9,812,363 B1 | 11/2017 | Liao et al. | |
| 9,859,380 B2 | 1/2018 | Lee et al. | |
| 2007/0023842 A1* | 2/2007 | Jung | H01L 21/28088 |
| | | | 257/E21.639 |
| 2007/0063266 A1* | 3/2007 | Natori | H01L 29/7881 |
| | | | 257/E29.302 |
| 2009/0047796 A1* | 2/2009 | Yu | H01L 21/3105 |
| | | | 257/E21.241 |
| 2009/0181530 A1* | 7/2009 | Lisiansky | H01L 29/513 |
| | | | 257/E21.159 |
| 2010/0330812 A1* | 12/2010 | Akiyama | H01L 21/02178 |
| | | | 257/E21.24 |
| 2012/0129330 A1* | 5/2012 | Kim | H01L 21/823842 |
| | | | 438/591 |
| 2013/0040455 A1 | 2/2013 | Chan et al. | |
| 2014/0242808 A1* | 8/2014 | Akiyama | H01L 21/67115 |
| | | | 118/704 |
| 2015/0311067 A1 | 10/2015 | Sharma et al. | |
| 2016/0254365 A1 | 9/2016 | Tsai et al. | |
| 2017/0005006 A1* | 1/2017 | Ando | H01L 21/28185 |
| 2017/0062572 A1* | 3/2017 | Yoo | H01L 29/7848 |
| 2019/0378913 A1 | 12/2019 | Li et al. | |
| 2021/0074593 A1* | 3/2021 | Savant | H01L 21/823842 |
| 2021/0375629 A1* | 12/2021 | Lai | H01L 21/31111 |
| 2021/0407995 A1* | 12/2021 | Chiu | H01L 29/41791 |

FOREIGN PATENT DOCUMENTS

| | | |
|---|---|---|
| TW | 201543572 A | 11/2015 |
| TW | 202002091 A | 1/2020 |

OTHER PUBLICATIONS

Yew et al. "A new method for enhancing high-k/metal-gate stack performance and reliability for high-k last integration," Feb. 2013, IEEE Electron Device Letters, vol. 34, No. 2, pp. 295-297 (Year: 2013).*

* cited by examiner

HIGH-K GATE DIELECTRIC AND METHOD FORMING SAME

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
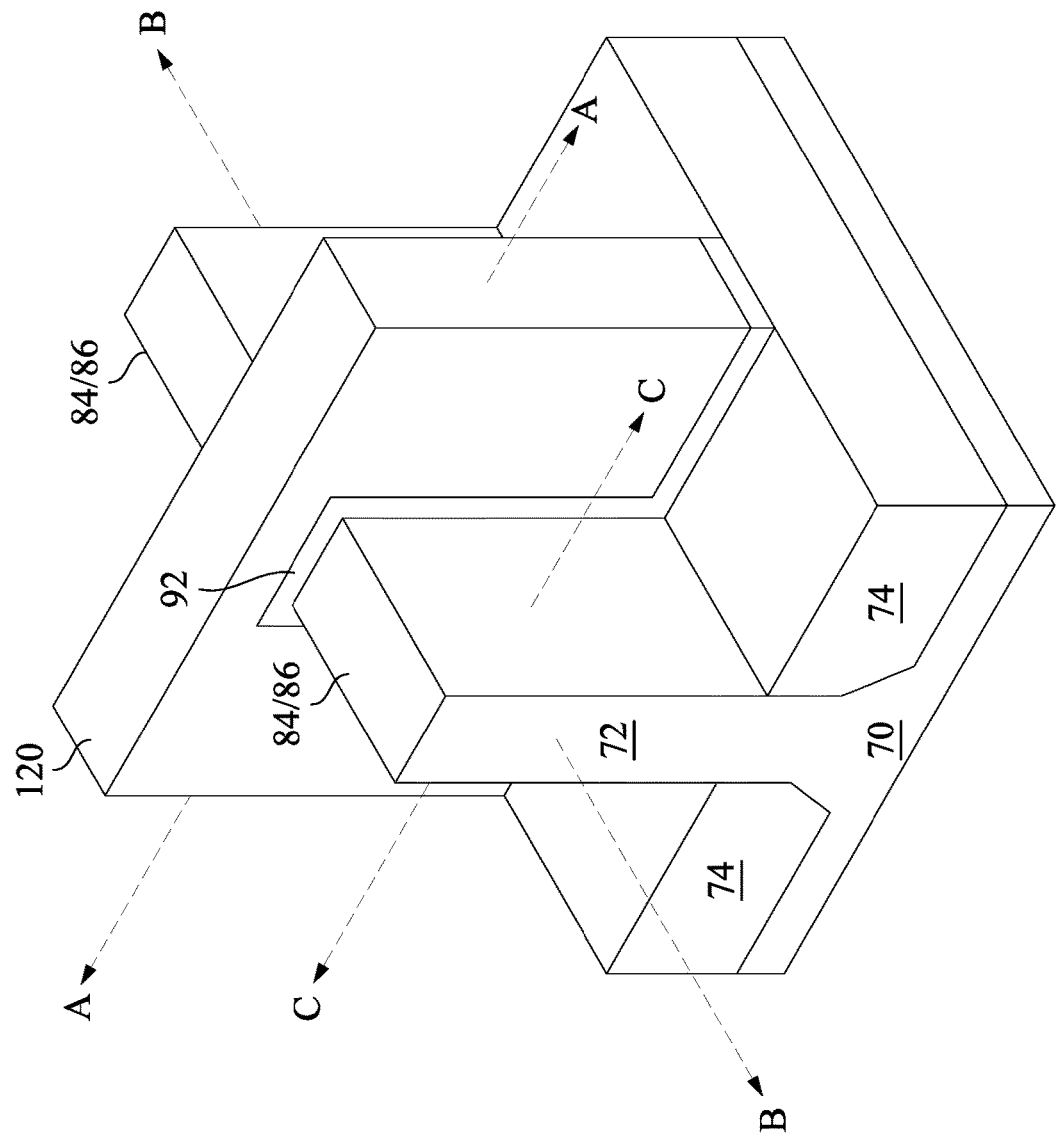
FIG. 1 is an example of a fin Field-Effect Transistor (finFET) in a three-dimensional view in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include methods applied to, but not limited to depositing a gate dielectric layer along sidewalls and over a top surface of a fin and performing annealing processes on the gate dielectric layer. The annealing processes may be carried out at temperatures in a range from about 1000° C. to about 1150° C. As a result, the gate dielectric layer is highly crystallized and hence strengthened leading to less gate dielectric loss during subsequent metal gate patterning processes. In addition, the use of microsecond annealing processes results in reduced dopant diffusion at junctions, and allows for the use of higher annealing peak temperatures while having reduced drain induced barrier lowering effects.

FIG. 1 illustrates an example of a FinFET in a three-dimensional view, in accordance with some embodiments. The FinFET comprises a fin 72 on a substrate 70 (e.g., a semiconductor substrate). Isolation regions 74 are disposed in the substrate 70, and the fin 72 protrudes above and from between neighboring isolation regions 74. Although the isolation regions 74 are described/illustrated as being separate from the substrate 70, as used herein the term "substrate" may be used to refer to just the semiconductor substrate or a semiconductor substrate inclusive of isolation regions. Additionally, although the fin 72 is illustrated as a single, continuous material as the substrate 70, the fin 72 and/or the substrate 70 may comprise a single material or a plurality of materials. In this context, the fin 72 refers to the portion extending between the neighboring isolation regions 74.

A gate dielectric layer 92 is along sidewalls and over a top surface of the fin 72, and a gate electrode 120 is over the gate dielectric layer 92. Source/drain regions 84 or 86 are disposed in opposite sides of the fin 72 with respect to the gate dielectric layer 92 and gate electrode 120. FIG. 1 further illustrates reference cross-sections that are used in later figures. Cross-section A-A is along a longitudinal axis of the gate electrode 120 and in a direction, for example, perpendicular to the direction of current flow between the source/drain regions 84/86 of the FinFET. Cross-section B-B is perpendicular to cross-section A-A and is along a longitudinal axis of the fin 72 and in a direction of, for example, a current flow between the source/drain regions 84/86 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 26C are cross-sectional views of intermediate stages in the manufacturing of finFETs in accordance with an exemplary embodiment. FIGS. 2, 3, 4A, 5A, and 26A illustrate reference cross-section A-A illustrated in FIG. 1, except for multiple fins. FIGS. 4B, 5B, 6A, 7 through 25, and 26B illustrate reference cross-section B-B illustrated in FIG. 1, except for multiple finFETs. FIGS. 6B, 6C, and 26C illustrate reference cross-section C-C illustrated in FIG. 1, except for multiple finFETs.

Figure 2:
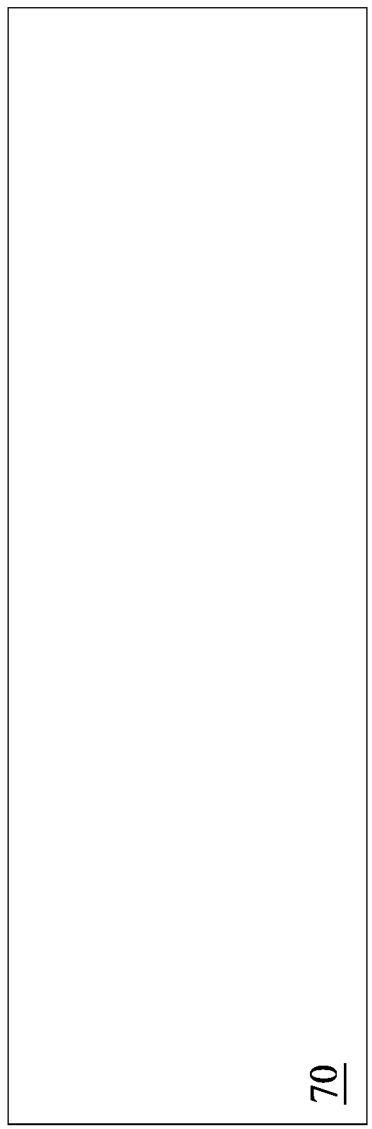
FIGS. 2, 3, 4A, 4B, 5A, 5B, 6A, 6B, 6C, 7, 8, 9, 10, 11, 12, 13, 14, 15, 16, 17, 18, 19, 20, 21, 22, 23, 24, 25, 26A, 26B and 26C are cross-sectional views of intermediate stages in the manufacturing of finFETs in accordance with some embodiments.

FIG. 2 illustrates a substrate 70. The substrate 70 may be a semiconductor substrate, such as a bulk semiconductor substrate, a semiconductor-on-insulator (SOI) substrate, a multi-layered or gradient substrate, or the like. The substrate 70 may include a semiconductor material, such as an elemental semiconductor including Si and Ge; a compound or alloy semiconductor including SiC, SiGe, GaAs, GaP, GaAsP, AlInAs, AlGaAs, GaInAs, InAs, GaInP, InP, InSb, and/or GaInAsP; or a combination thereof. The substrate 70 may be doped or un-doped. In a specific example, the substrate 70 is a bulk silicon substrate.

Figure 3:
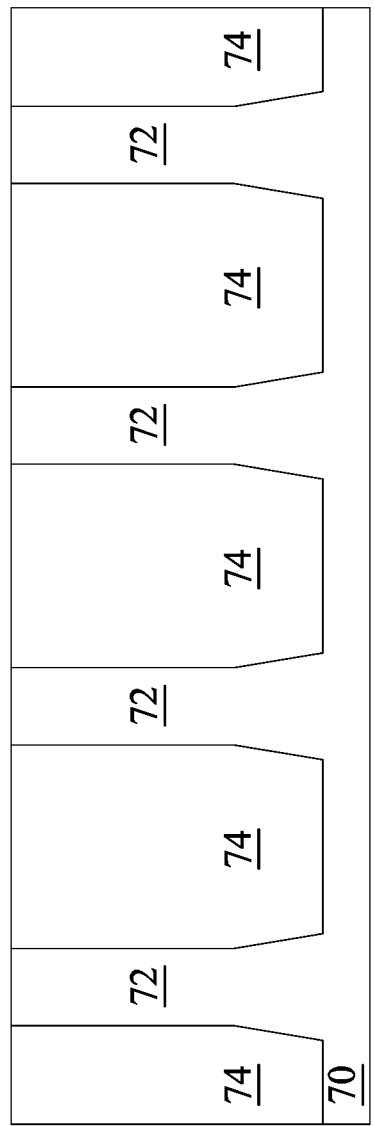

FIG. 3 illustrates the formation of fins 72 and isolation regions 74 between neighboring fins 72. In FIG. 3, fins 72 are formed in the substrate 70. In some embodiments, the fins 72 may be formed in the substrate 70 by etching trenches in the substrate 70. The etching may be any acceptable etch process, such as a reactive ion etch (RIE), neutral beam etch (NBE), the like, or a combination thereof. The etch may be anisotropic.

Further in FIG. 3, an insulation material is formed between neighboring fins 72 to form the isolation regions 74. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. Further in FIG. 3, a planarization process, such as a chemical mechanical polish (CMP), may remove any excess insulation material and form top surfaces of the isolation regions 74 and top surfaces of the fins 72 that are co-planar.

Although not specifically illustrated, appropriate wells may be formed in the fins 72 and/or substrate 70. For example, an n-well may be formed in a first region 200, third region 400, and a fourth region 500 (illustrated in FIG. 4B and subsequent figures) of the substrate 70 where p-type devices, such as p-type finFETs, are to be formed, and a p-well may be formed in a second region 300 of the substrate 70 (illustrated in FIG. 4B and subsequent figures) where n-type devices, such as n-type finFETs, are to be formed.

For example, to form an n-well in the first region 200, third region 400, and the fourth region 500, a photoresist can be formed over the fins 72 and the isolation regions 74 in the second region 300 of the substrate 70. The photoresist can be patterned to expose the first region 200, the third region 400, and the fourth region 500 of the substrate 70. The photoresist can be formed by using a spin-on technique and can be patterned using acceptable photolithography techniques. Once the photoresist is patterned, an n-type impurity implant can be performed in the first region 200, the third region 400, and the fourth region 500, and the photoresist may act as a mask to substantially prevent n-type impurities from being implanted into the second region 300. The n-type impurities may be phosphorus, arsenic, or the like implanted in the first region 200, the third region 400, and the fourth region 500 to a concentration of equal to or less than $10^{18}$ cm$^{-3}$, such as between about $10^{17}$ cm$^{-3}$ and about $10^{18}$ cm$^{-3}$. After the implant, the photoresist can be removed, such as by an acceptable ashing process.

Further, to form a p-well in the second region 300, a photoresist can be formed over the fins 72 and the isolation regions 74 in the first region 200, the third region 400, and the fourth region 500 of the substrate. The photoresist can be patterned to expose the second region 300 of the substrate 70. The photoresist can be formed by using a spin-on technique and can be patterned using acceptable photolithography techniques. Once the photoresist is patterned, a p-type impurity implant may be performed in the second region 300, and the photoresist may act as a mask to substantially prevent p-type impurities from being implanted into the first region 200, the third region 400, and the fourth region 500. The p-type impurities may be boron, BF$_2$, or the like implanted in the second region 300 to a concentration of equal to or less than $10^{18}$ cm$^{-3}$, such as between about $10^{17}$ cm$^{-3}$ and about $10^{18}$ cm$^{-3}$. After the implant, the photoresist can be removed, such as by an acceptable ashing process. After the implants, an anneal may be performed to activate the p-type and n-type impurities that were implanted. The implantations may form an n-well in the first region 200, the third region 400, and the fourth region 400 and a p-well in the second region 300. In some embodiments, the implantations in each of the first region 200, the second region 300, the third region 400, and the fourth region 500 of the substrate are not limited to the description above and may form either a p-well or an n-well such that either an n-type finFET or a p-type finFET may be formed in each of these regions of the substrate 70.

Figure 4A:
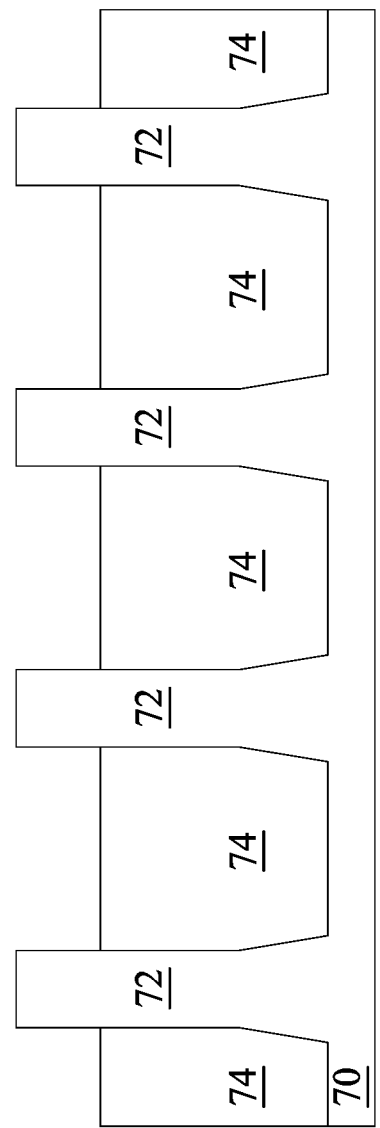
Figure 4B:
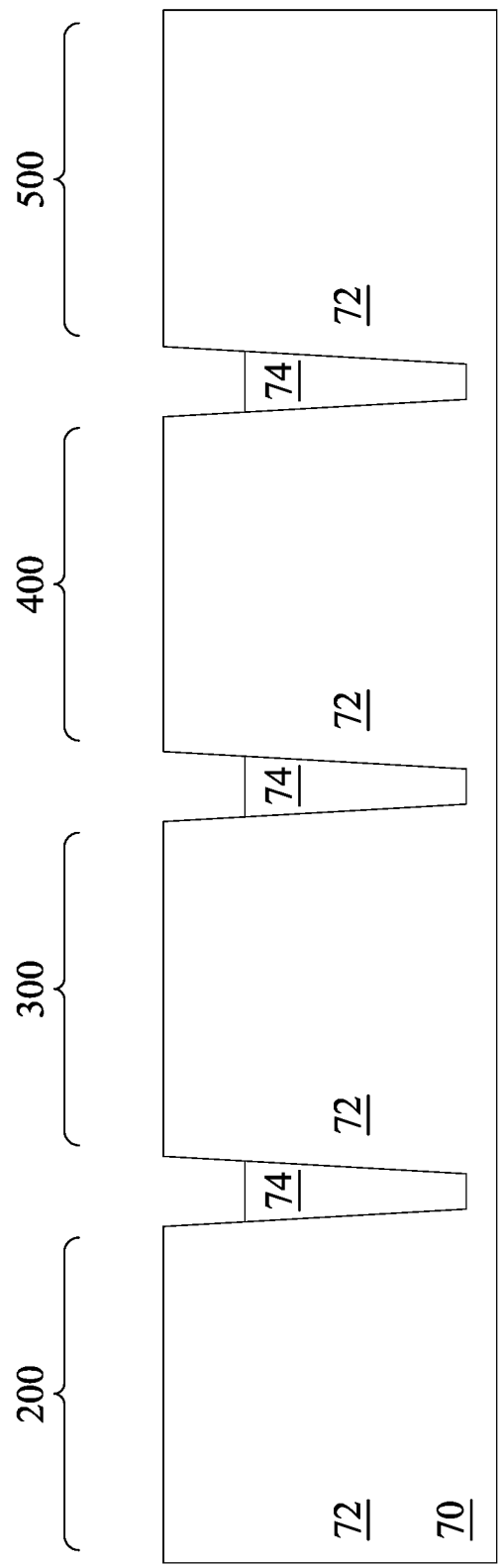

In FIGS. 4A and 4B, the isolation regions 74 are recessed, such as to form Shallow Trench Isolation (STI) regions. The isolation regions 74 are recessed such that fins 72 protrude from between neighboring isolation regions 74. The isolation regions 74 may be recessed using an acceptable etching process, such as one that is selective to the material of the isolation regions 74. For example, a chemical oxide removal using a CERTAS® etch or an Applied Materials SICONI tool or dilute hydrofluoric (dHF) acid may be used.

A person having ordinary skill in the art will readily understand that the process described with respect to FIGS. 2, 3, 4A, and 4B is just one example of how fins may be formed. In other embodiments, a dielectric layer can be formed over a top surface of the substrate 70; trenches can be etched through the dielectric layer; epitaxial fins can be epitaxially grown in the trenches; and the dielectric layer can be recessed such that the homoepitaxial and/or heteroepitaxial structures protrude from the dielectric layer to form epitaxial fins. It may be advantageous to epitaxially grow a material or epitaxial fin structure for n-type finFETs different from the material or epitaxial fin structure for p-type finFETs.

Figure 5A:
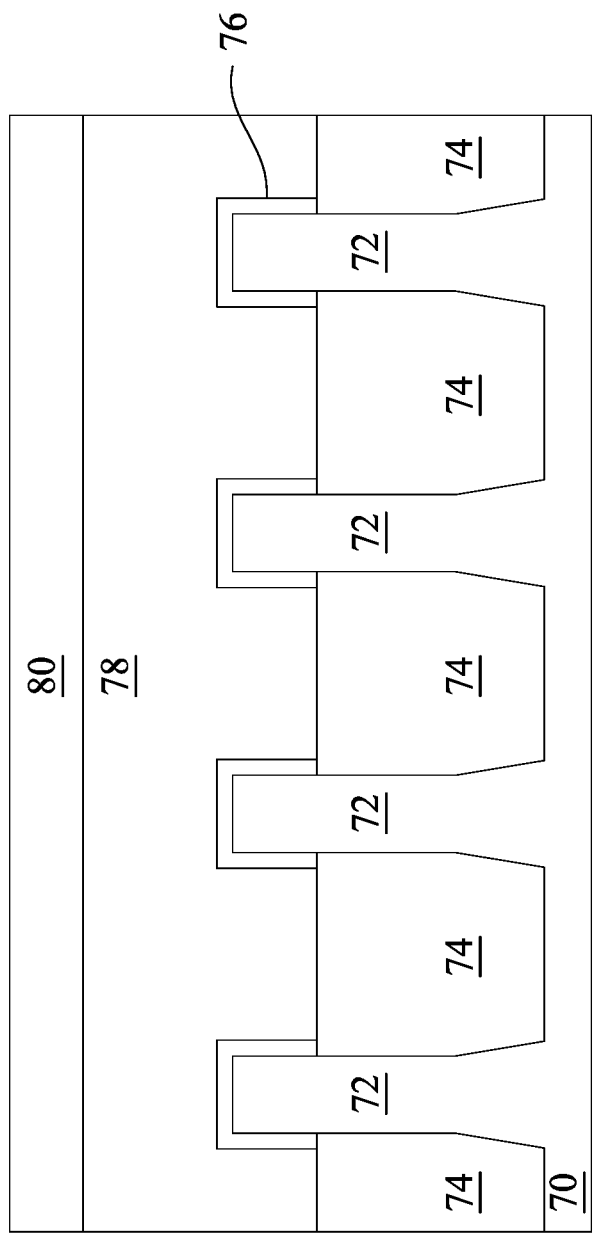
Figure 5B:
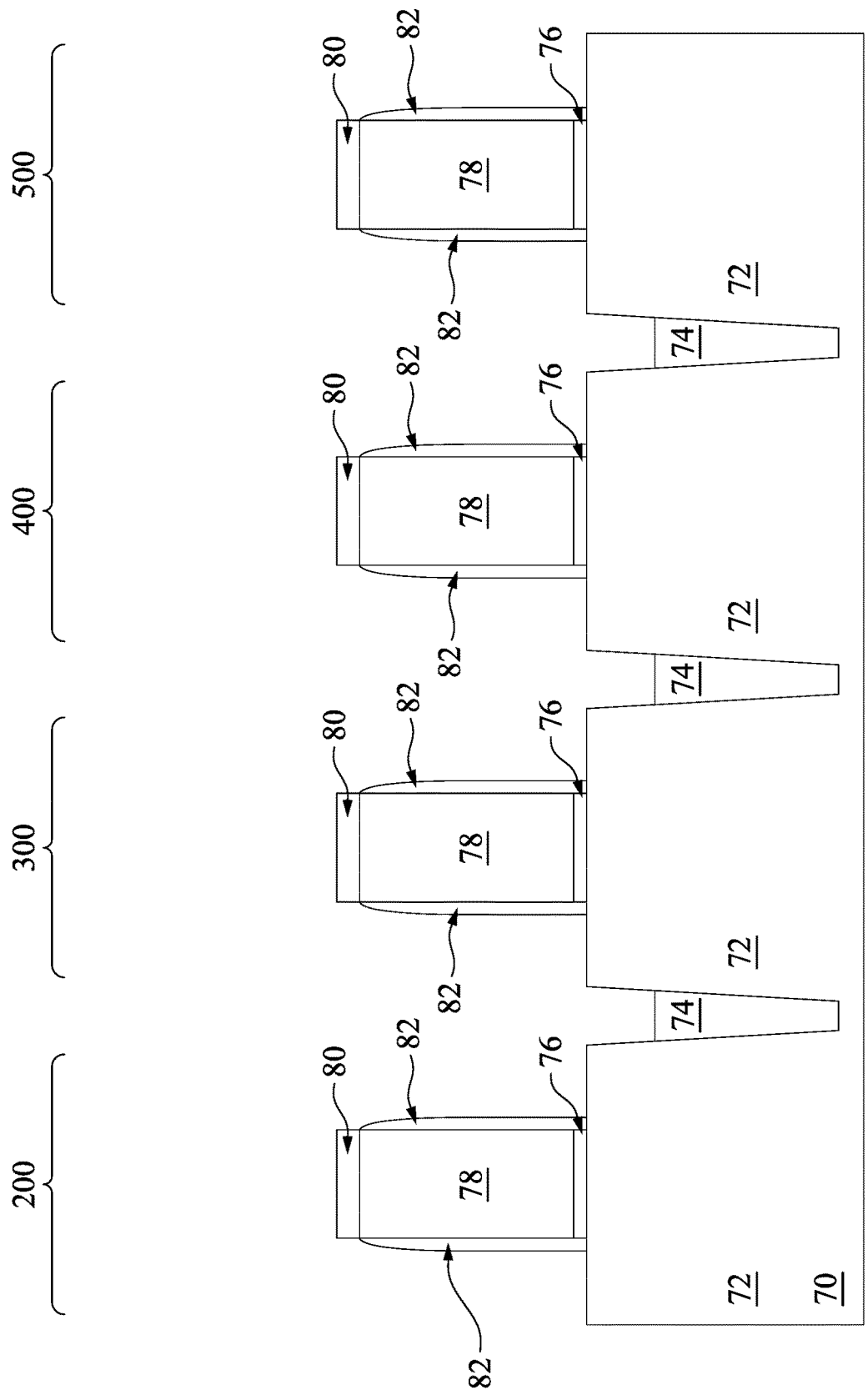

In FIGS. 5A and 5B, a dummy dielectric layer is formed on the fins 72. The dummy dielectric layer may be, for example, silicon oxide, silicon nitride, a combination thereof, or the like, and may be deposited or thermally grown according to acceptable techniques, such as Chemical Vapor Deposition (CVD), thermal oxidation, or the like. A dummy gate layer is formed over the dummy dielectric layer, and a mask layer is formed over the dummy gate layer. The dummy gate layer may be deposited, such as by using CVD or the like, over the dummy dielectric layer and then planarized, such as by a CMP. The mask layer may be deposited, such as by using CVD or the like, over the dummy gate layer. The dummy gate layer may comprise, for example, polysilicon, although other materials that have a high etching selectivity may also be used. The mask layer may comprise, for example, silicon nitride, silicon oxynitride, silicon carbon nitride, or the like.

Further in FIGS. 5A and 5B, the mask layer may be patterned using acceptable photolithography and etching techniques to form masks 80. The pattern of the masks 80 then may be transferred to the dummy gate layer and the dummy dielectric layer by an acceptable etching technique to form dummy gates 78 and dummy gate dielectrics 76 from the dummy gate layer and the dummy dielectric layer, respectively. The etching may comprise an acceptable anisotropic etching, such as RIE, NBE, or the like. The dummy gates 78 cover respective channel regions of the fins 72. The dummy gates 78 may also have a lengthwise direction substantially perpendicular to the lengthwise direction of respective fins 72.

Although not specifically illustrated, implants for lightly doped source/drain (LDD) regions may be performed. Similar to the implants discussed above, a mask, such as a photoresist, may be formed over the second region 300, e.g., for n-type devices, while exposing the first region 200, the third region 400, and the fourth region 500, e.g., for p-type devices, and p-type impurities may be implanted into the exposed fins 72 in the first region 200, the third region 400, and the fourth region 500. The mask may then be removed. Subsequently, a mask, such as a photoresist, may be formed over the first region 200, the third region 400, and the fourth region 500 while exposing the second region 300, and n-type impurities may be implanted into the exposed fins 72 in the second region 300. The mask may then be removed. The n-type impurities may be any of the n-type impurities previously discussed, and the p-type impurities may be any of the p-type impurities previously discussed. The lightly doped source/drain regions may have a concentration of impurities from about $10^{15}$ cm$^{-3}$ to about $10^{16}$ cm$^{-3}$. An anneal may be used to activate the implanted impurities.

Further in FIGS. 5A and 5B, gate spacers 82 are formed along sidewalls of the dummy gates 78 and dummy gate dielectrics 76. The gate spacers 82 may be formed by conformally depositing, such as by CVD or the like, a material and subsequently anisotropically etching, such as RIE, NBE, or the like, the material. The material of the gate spacers 82 may be silicon nitride, silicon carbon nitride, a combination thereof, or the like.

Figure 6A:
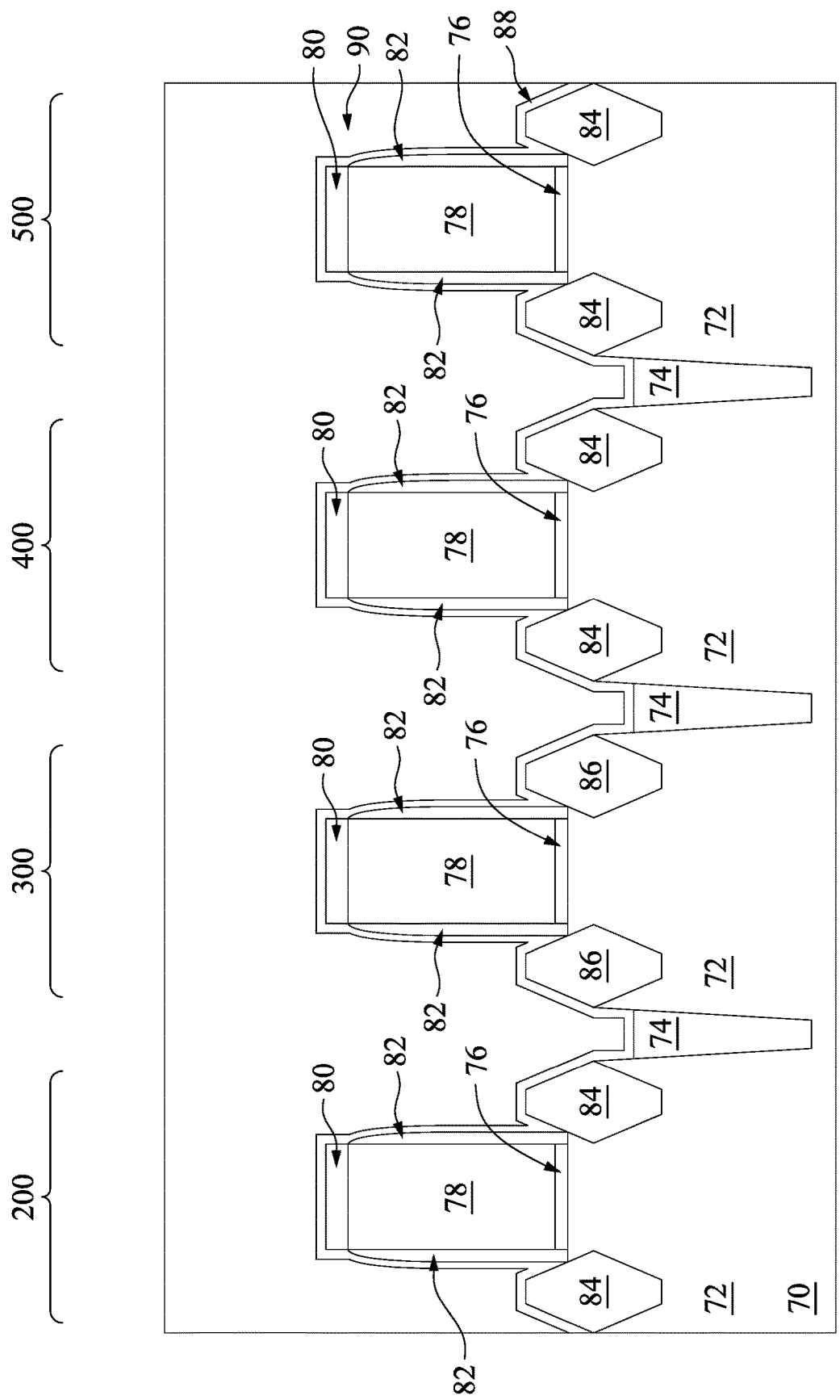
Figure 6C:
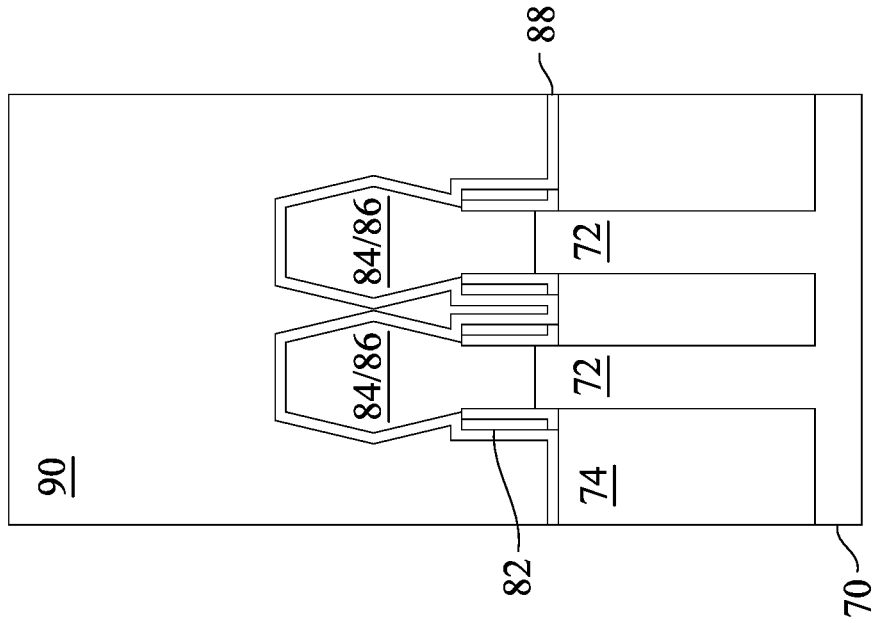
Figure 6B:
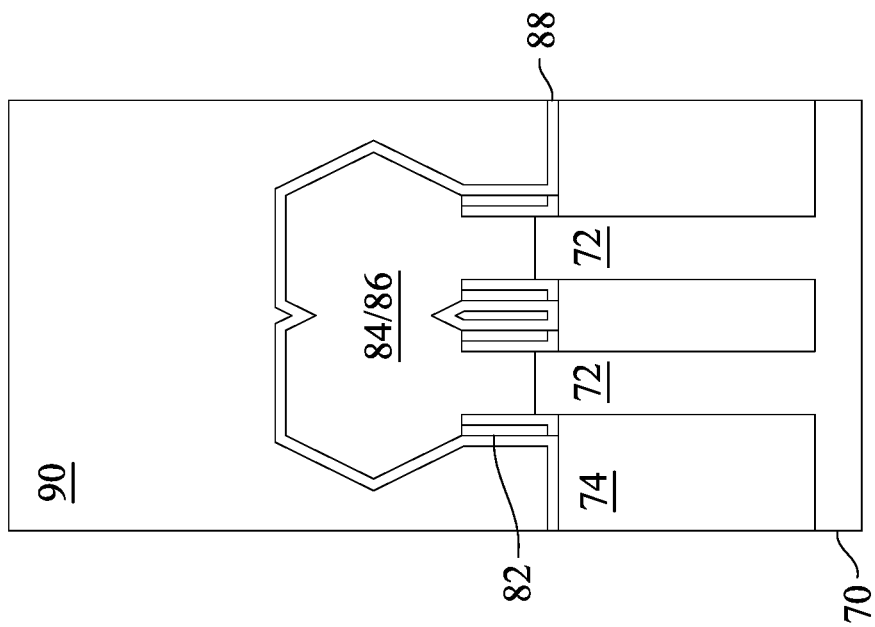

In FIGS. 6A, 6B, and 6C, epitaxial source/drain regions 84 and 86 are formed in the source/drain region of the fins 72. In the first region 200, the third region 400, and the fourth region 500, epitaxial source/drain regions 84 are formed in the source/drain regions of the fins 72 such that each dummy gate 78 is disposed between ones of a respective pair of the epitaxial source/drain regions 84 in each fin 72. In the second region 300, epitaxial source/drain regions 86 are formed in the source/drain regions of the fins 72 such that each dummy gate 78 is disposed between ones of a respective pair of the epitaxial source/drain regions 86 in each fin 72.

The epitaxial source/drain regions 84 in the first region 200, the third region 400, and the fourth region 500, e.g., for p-type devices, may be formed by masking, such as with a hard mask, the second region 300, e.g., for n-type devices. Then, source/drain regions of the fins 72 in the first region 200, the third region 400, and the fourth region 500 are etched to form recesses. The etch may be any appropriate etch selective to the fins 72 and may be anisotropic. The epitaxial source/drain regions 84 in the first region 200, the third region 400, and the fourth region 500 are then epitaxially grown in the recesses. The epitaxial growth may be by using Metal-Organic CVD (MOCVD), Molecular Beam Epitaxy (MBE), Liquid Phase Epitaxy (LPE), Vapor Phase Epitaxy (VPE), the like, or a combination thereof. The epitaxial source/drain regions 84 may comprise any acceptable material, such as appropriate for p-type finFETs. For example, the epitaxial source/drain regions 84 may comprise SiGe, SiGeB, Ge, GeSn, or the like. In some embodiments, the epitaxial source/drain regions 84 may exert a compressive strain on channel regions of the fins 72, thereby improving p-type device performance. The epitaxial source/drain regions 84 may have surfaces raised from respective outer surfaces of the fins 72 and may have facets. The mask may then be removed, such as by using an etch selective to the material of the mask.

The epitaxial source/drain regions 86 in the second region 300 may be formed by masking, such as with a hard mask, the first region 200, the third region 400, and the fourth region 500. Then, source/drain regions of the fins 72 in the second region 300 are etched to form recesses. The etch may be any appropriate etch selective to the fins 72 and may be anisotropic. The epitaxial source/drain regions 86 in the second region 300 are then epitaxially grown in the recesses. The epitaxial growth may be by using MOCVD, MBE, LPE, VPE, the like, or a combination thereof. The epitaxial source/drain regions 86 may comprise any acceptable material, such as appropriate for n-type finFETs. For example, the epitaxial source/drain regions 86 may comprise silicon, SiC, SiCP, SiP, or the like. In some embodiments, the epitaxial source/drain regions 86 may exert a tensile strain on channel regions of the fins 72, thereby improving n-type device performance. The epitaxial source/drain regions 86 may have surfaces raised from respective outer surfaces of the fins 72 and may have facets. The mask may then be removed, such as by using an etch selective to the material of the mask.

The epitaxial source/drain regions 84 and 86 and/or source/drain regions of the fins 72 may be implanted with dopants, similar to the process previously discussed for forming lightly doped source/drain regions, followed by an anneal. The source/drain regions may have an impurity concentration of between about $10^{19}$ cm$^{-3}$ and about 10 cm$^{-3}$. The p-type impurities for source/drain regions in the first region 200, the third region 400 and the fourth region 500, e.g., for p-type devices, may be any of the p-type impurities previously discussed, and the n-type impurities for source/drain regions in the second region 300, e.g., for n-type devices, may be any of the n-type impurities previously discussed. In other embodiments, the epitaxial source/drain regions 84 and 86 may be in situ doped during growth.

As a result of the epitaxy processes used to form the epitaxial source/drain regions 84 and 86, upper surfaces of the epitaxial source/drain regions 84/86 have facets which expand laterally outward beyond sidewalls of the fins 72. In some embodiments, these facets cause adjacent source/drain regions 84/86 of a same FinFET to merge as illustrated by FIG. 6B. In other embodiments, adjacent source/drain regions 84/86 remain separated after the epitaxy process is completed as illustrated by FIG. 6C. In the embodiments illustrated in FIGS. 6B and 6C, gate spacers 82 are formed covering a portion of the sidewalls of the fins 72 that extend above the STI regions 76 thereby blocking the epitaxial growth. In some other embodiments, the spacer etch used to form the gate spacers 82 may be adjusted to remove the spacer material to allow the epitaxially grown region to extend to the surface of the STI region 76.

Further in FIGS. 6A, 6B, and 6C, an etch stop layer (ESL) 88 is conformally formed on epitaxial source/drain regions 84 and 86, gate spacers 82, masks 80, and isolation regions 74. In some embodiments, the ESL 88 may comprise silicon nitride, silicon carbonitride, or the like, formed using ALD, CVD, the like, or a combination thereof. A bottom inter-layer dielectric (ILD) 90 is deposited over the ESL 88. ILD 90 may comprise Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, plasma-enhanced CVD (PECVD), FCVD, the like, or a combination thereof.

Figure 7:
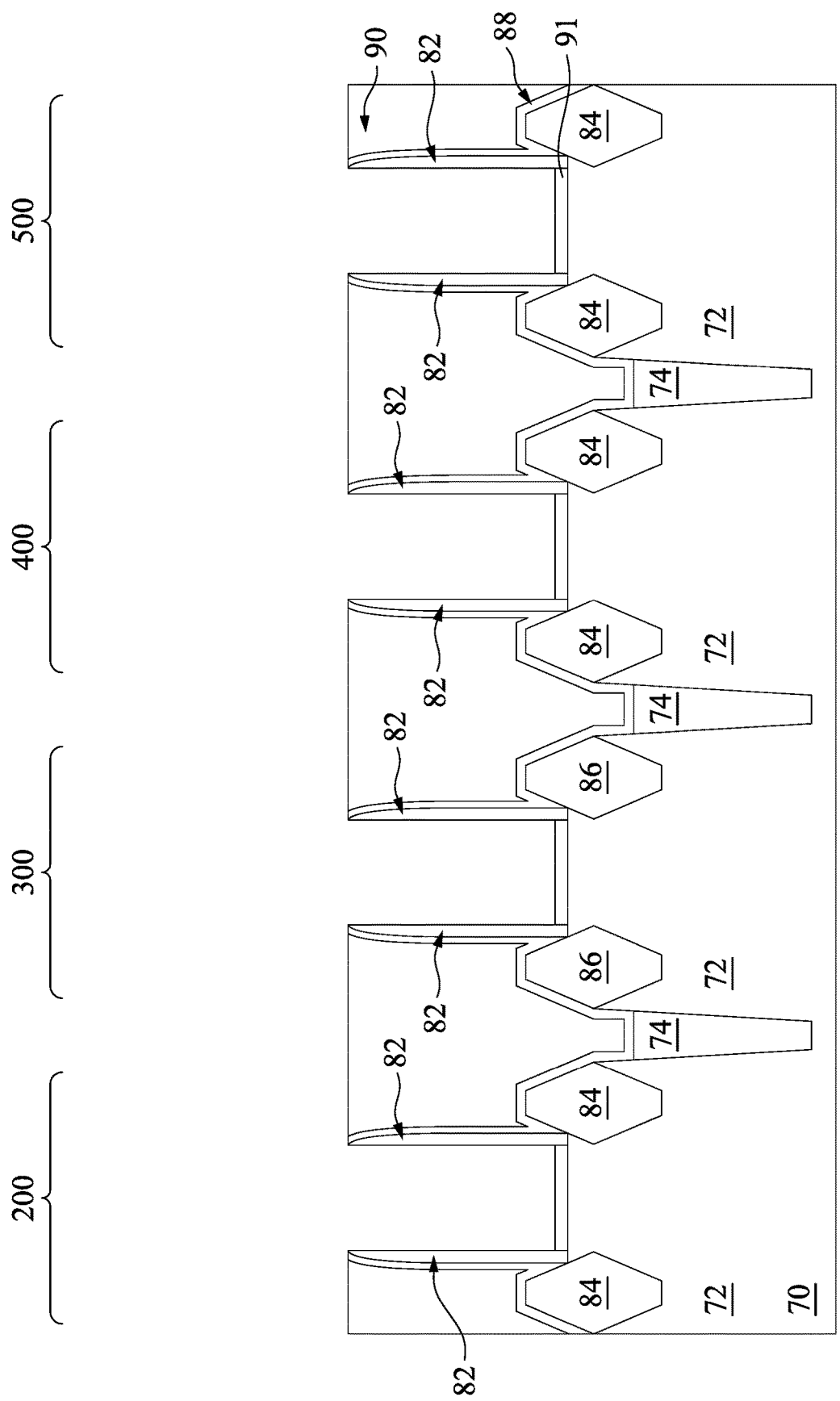

In FIG. 7, a planarization process, such as a CMP, is performed to level the top surface of ILD 90 with the top surfaces of the dummy gates 78. The CMP may also remove the masks 80 and the ESL 88 from over the dummy gates 78. Accordingly, top surfaces of the dummy gates 78 are exposed through the ILD 90. The dummy gates 78 and the dummy gate dielectrics 76 are removed in an etching step(s), so that openings through the ILD 90 and defined by the gate spacers 82 are formed to the fins 72. Each opening exposes a channel region of a respective fin 72. Each channel region is disposed between neighboring pairs of epitaxial source/drain regions 84 and 86. The etching step(s) may be selective to the materials of the dummy gates 78 and the dummy gate dielectrics 76, which etching may be a dry or wet etching. During the etching, the dummy gate dielectrics 76 may be used as an etch stop layer when the dummy gates 78 are etched. The dummy gate dielectric 76 may then be etched after the removal of the dummy gates 78. Although not specifically illustrated, depending on the similarity of materials used for the ILD 90 and the dummy gate dielectrics 76, the ILD 90 may be recessed when the dummy gate dielectrics 76 are removed, and this recessing may cause portions of the ESL 88 and/or gate spacers 82 to protrude above the top surface of the ILD 90.

An interfacial dielectric 91 is formed in each opening and on the fins 72. The interfacial dielectric 91 may be, for example, an oxide or the like formed by thermal oxidation, chemical oxidation, ALD, or the like. A thickness of the interfacial dielectric 91 may be in a range from about 0.7 nm to about 2 nm. In some embodiments, the dummy gate dielectric 76 is not completely removed from one or more of the openings, and a separate interfacial dielectric 91 need not be deposited in such openings. For example, remaining portions of the dummy gate dielectric 76 may be the interfacial dielectric 91.

Figure 8:
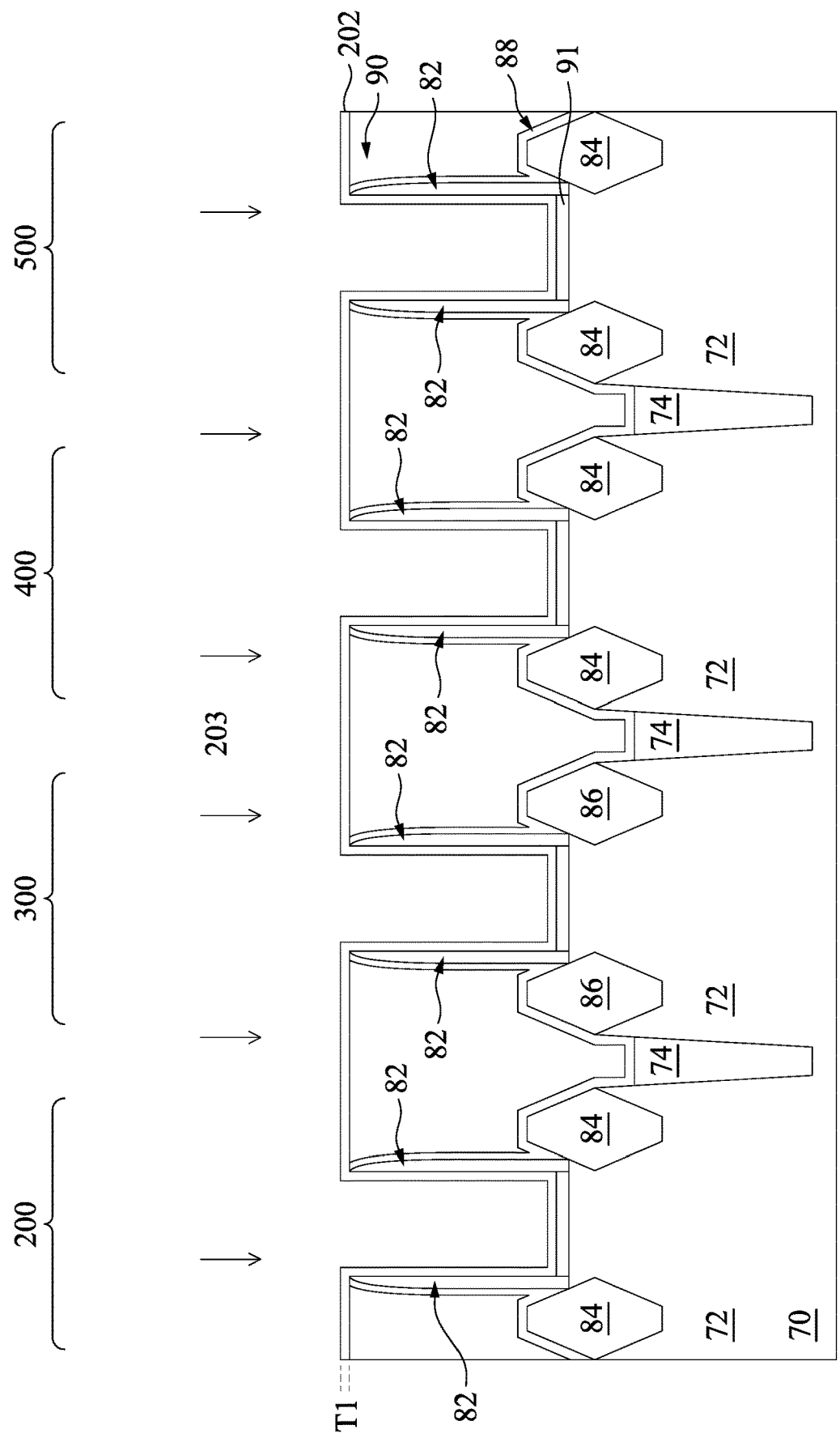

In FIG. 8, a first high-k dielectric layer 202 is deposited over the structure shown in FIG. 7. The first high-k dielectric layer 202 may be formed of a high-k dielectric material such as hafnium oxide ($HfO_2$), zirconium oxide ($ZrO_2$), titanium oxide ($TiO_2$), or the like, or the combinations thereof such as HfZrO, HfTiO, or the like. The first high-k dielectric layer 202 may be pure (such as comprising pure $HfO_2$, pure $ZrO_2$, or pure $TiO_2$) or substantially pure (for example, with the atomic percentage being greater than about 90 or 95 percent). The dielectric constant (k-value) of the first high-k dielectric layer 202 is higher than 3.9, and may be higher than about 7.0. The first high-k dielectric layer 202 overlies, and may physically contact, the interfacial dielectric 91. The first high-k dielectric layer 202 is formed as a conformal layer, and extends on the sidewalls of the fins 72 and the top surfaces and the sidewalls of gate spacers 82. In accordance with some embodiments of the present disclosure, the first high-k dielectric layer 202 is formed using ALD or CVD. The deposition temperature may be in the range between about 200° C. and about 400° C. The thickness T1 of the first high-k dielectric layer 202 may be in a range between about 1 nm and about 4 nm.

Further referring to FIG. 8, a first anneal process 203 is performed. In some embodiments, the first anneal process 203 is a microsecond anneal (μssA), which uses a diode laser or a CO laser to achieve a rapid ramp of temperature. In some embodiments, the temperature ramp rate is in a range from about 1,000,000° C./sec to about 100,000,000° C./sec.

The first anneal process 203 includes a preheat at a first temperature Tp 1, which may be in a range from about 400° C. to about 750° C. Then, the temperature is ramped up to a peak annealing temperature Tp 2, which may be in a range from about 1000° C. to about 1150° C. for an annealing duration that may be in a range from about 1 ms to about 30 ms. After the first anneal process 203, a post heat temperature Tp3 is maintained which may be in a range from about 500° C. to about 700° C. The annealing process may be performed in an ambient environment that comprises a gas such as $N_2$, Ar, or a mixture thereof. The first anneal process 203 may increase the crystallinity percentage of the first high-k dielectric layer 202.

Figure 9:
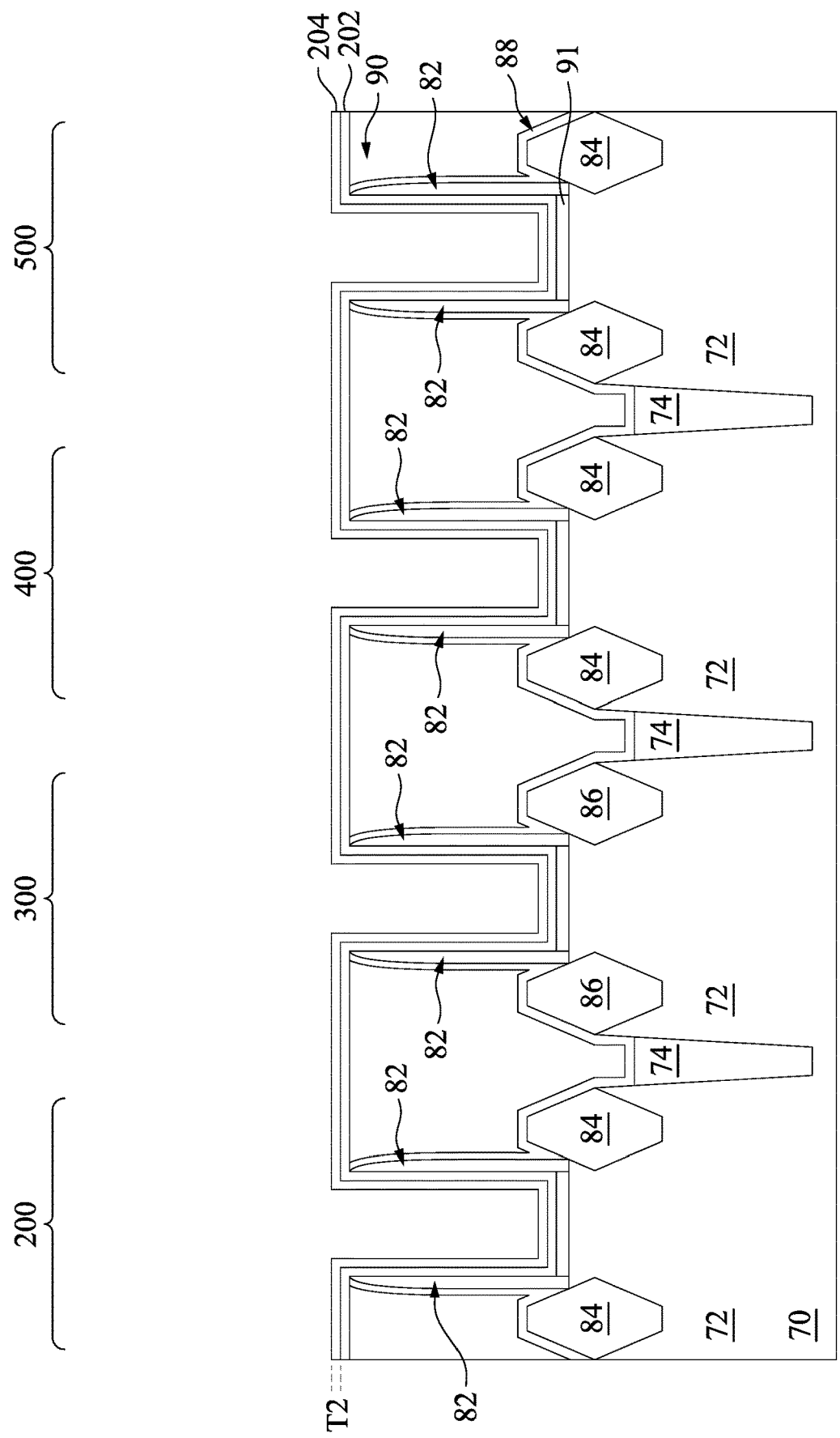

In FIG. 9, a first capping layer 204 is deposited over the structure shown in FIG. 8. The first capping layer 204 is formed through a conformal deposition process such as an ALD process, a CVD process, or the like. The first capping layer 204 may include a dopant such as lanthanum, aluminum, yttrium, titanium, magnesium, niobium, gallium, indium or the like.

The first capping layer 204 may be an oxide and/or nitride of the dopant. For example, the first capping layer 204 may comprise lanthanum oxide ($La_2O_3$), lanthanum nitride (LaN), aluminum oxide ($Al_2O_3$), aluminum nitride (AlN), or the like, or combinations thereof. The thickness T2 of the first capping layer 204 may be in a range from about 0.5 nm and about 2 nm.

Figure 10:
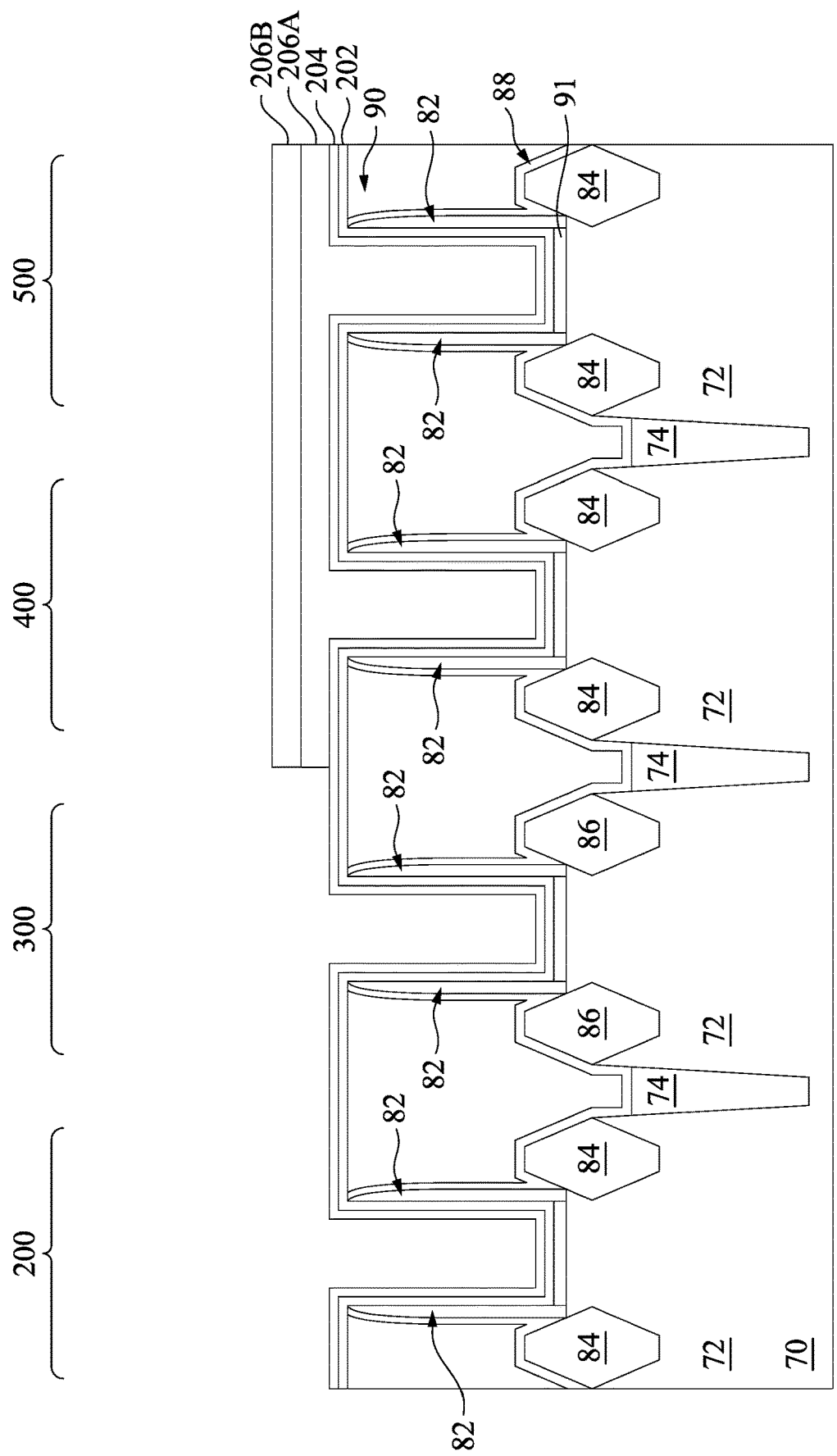

In FIG. 10, etching mask 206 is formed over the structure shown in FIG. 9 and patterned. The etching mask can be patterned to expose the first region 200 and the second region 300 of the substrate 70. In accordance with some embodiments, etching mask 206 includes a Bottom Anti-Reflective Coating (BARC) 206A, and a photo resist 206B over BARC 206A. A hard mask (not shown) may also be added underlying BARC 206A to assist the etching process. The hard mask may be formed a metal oxide such as titanium oxide or boron nitride, a metal nitride such as a titanium nitride, or may include a metal nitride layer over a metal oxide layer. In some embodiments, the etching mask 206 may be patterned to expose any regions of the substrate (e.g., the first region 200, the second region 300, the third region 400, and the fourth region 500) and the exposed regions are not limited to the description above.

Figure 11:
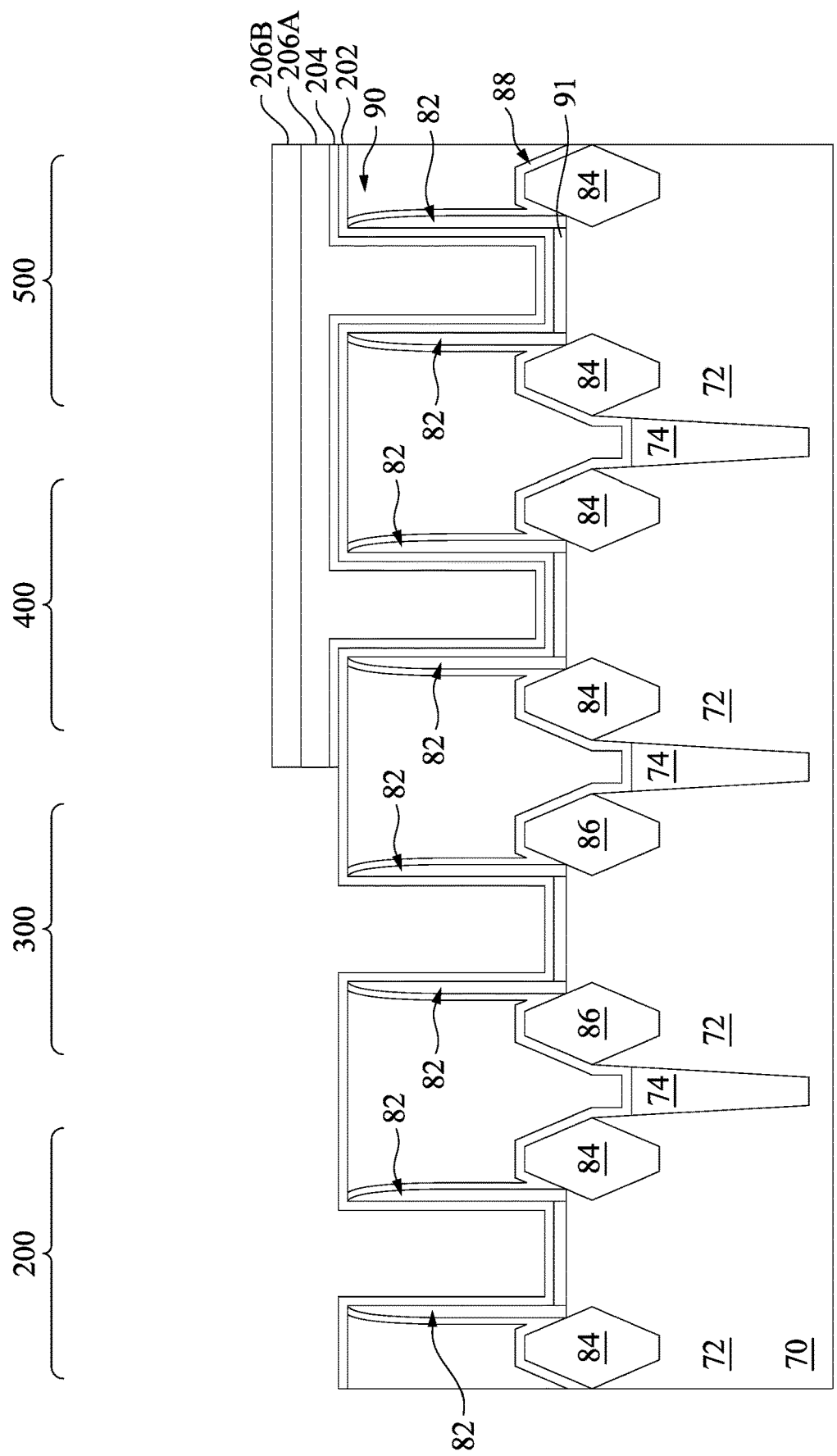

In FIG. 11, an etching process is performed, in which etching mask 206 is used to remove the first capping layer 204 in the first region 200 and the second region 300. As a result, the first high-k dielectric layer 202 is revealed in the first region 200 and the second region 300. In accordance with some embodiments of the present disclosure, the etching process is performed through wet etching, or the like.

Figure 12:
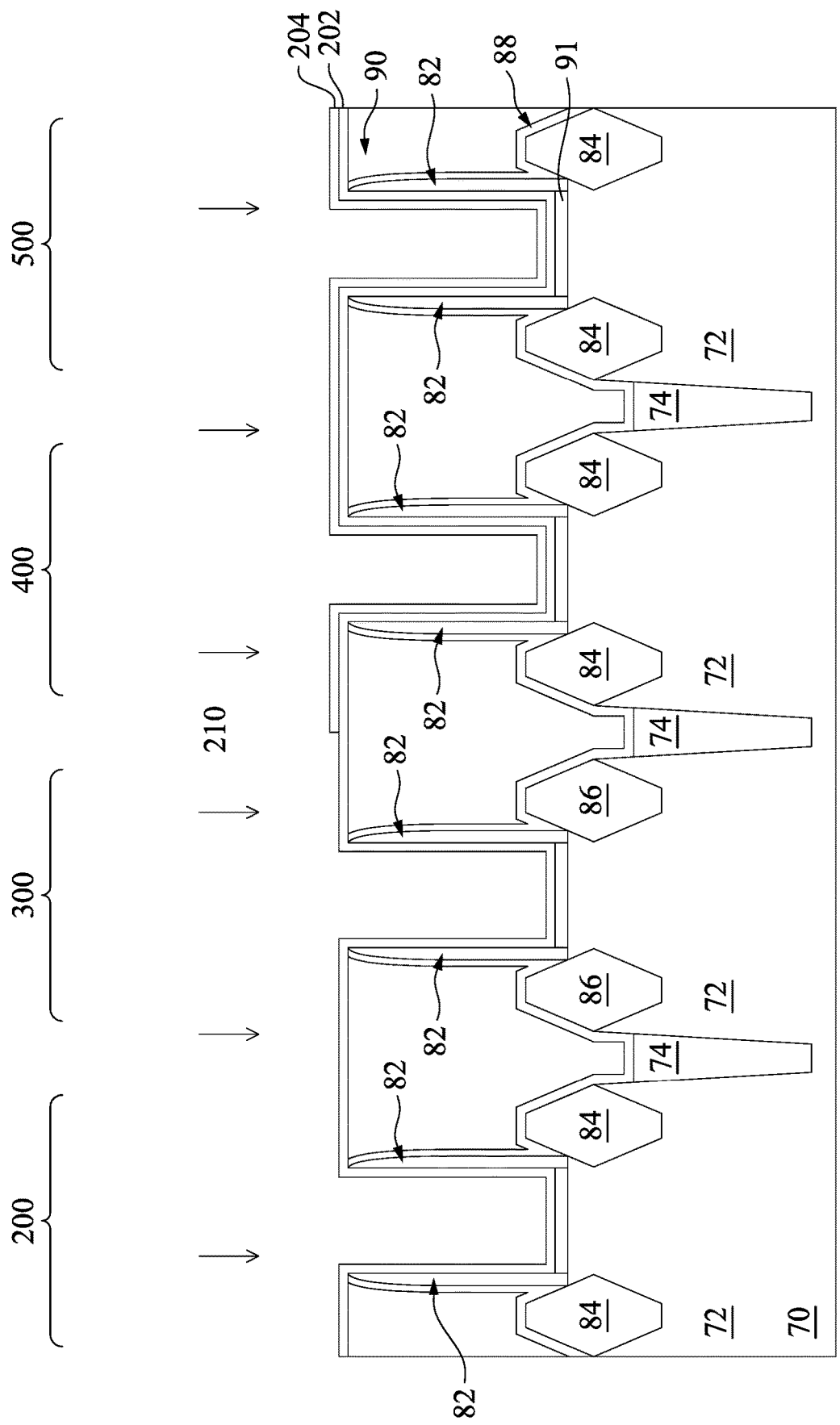

In FIG. 12, the etching mask 206 is then removed, resulting in the first capping layer 204 remaining over the first high-k dielectric layer 202 in the third region 400 and the fourth region 500, while there is no first capping layer 204 over the first high-k dielectric layer 202 in the first region 200 and the second region 300. In some embodiments, the etching mask 206 (described above in FIG. 10) may be patterned to expose any regions of the substrate (e.g., any of the first region 200, the second region 300, the third region 400, and the fourth region 500) and the first capping layer 204 in these regions removed by the etching process (described above in FIG. 11). Further, one or more annealing processes 210 may be performed. The annealing duration of each of the anneal processes may be in a range from about 0.5 seconds to about 5 minutes, and the annealing temperature of each of the anneal processes may be in a range from about 500° C. to about 950° C.

Figure 13:
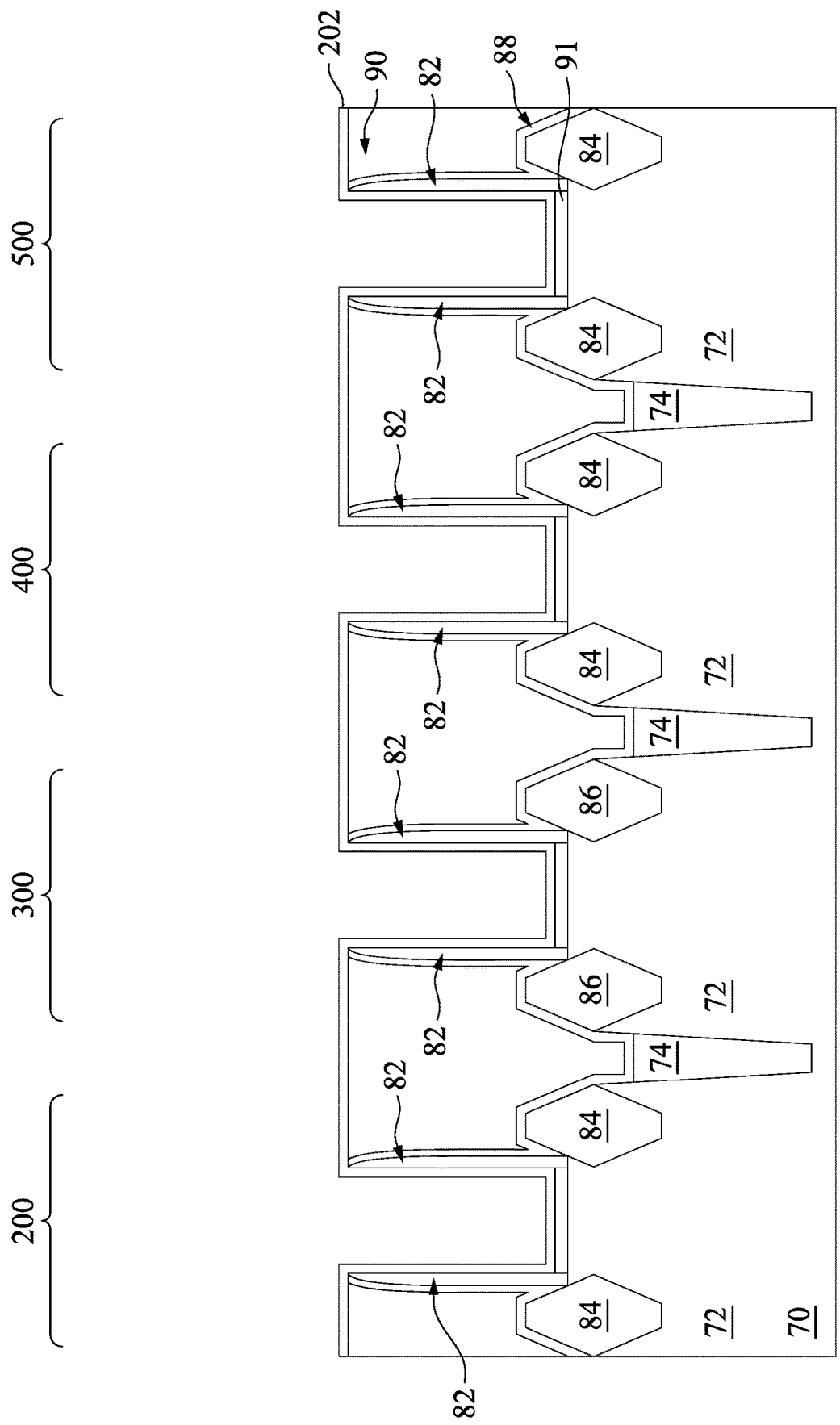

In FIG. 13, the first capping layer 204 is removed in an etching process. The etching process may be selected from the same group of candidate processes, and using the same group of candidate etching chemicals, as the etching process shown in FIG. 11. The details are thus not repeated herein.

Figure 14:
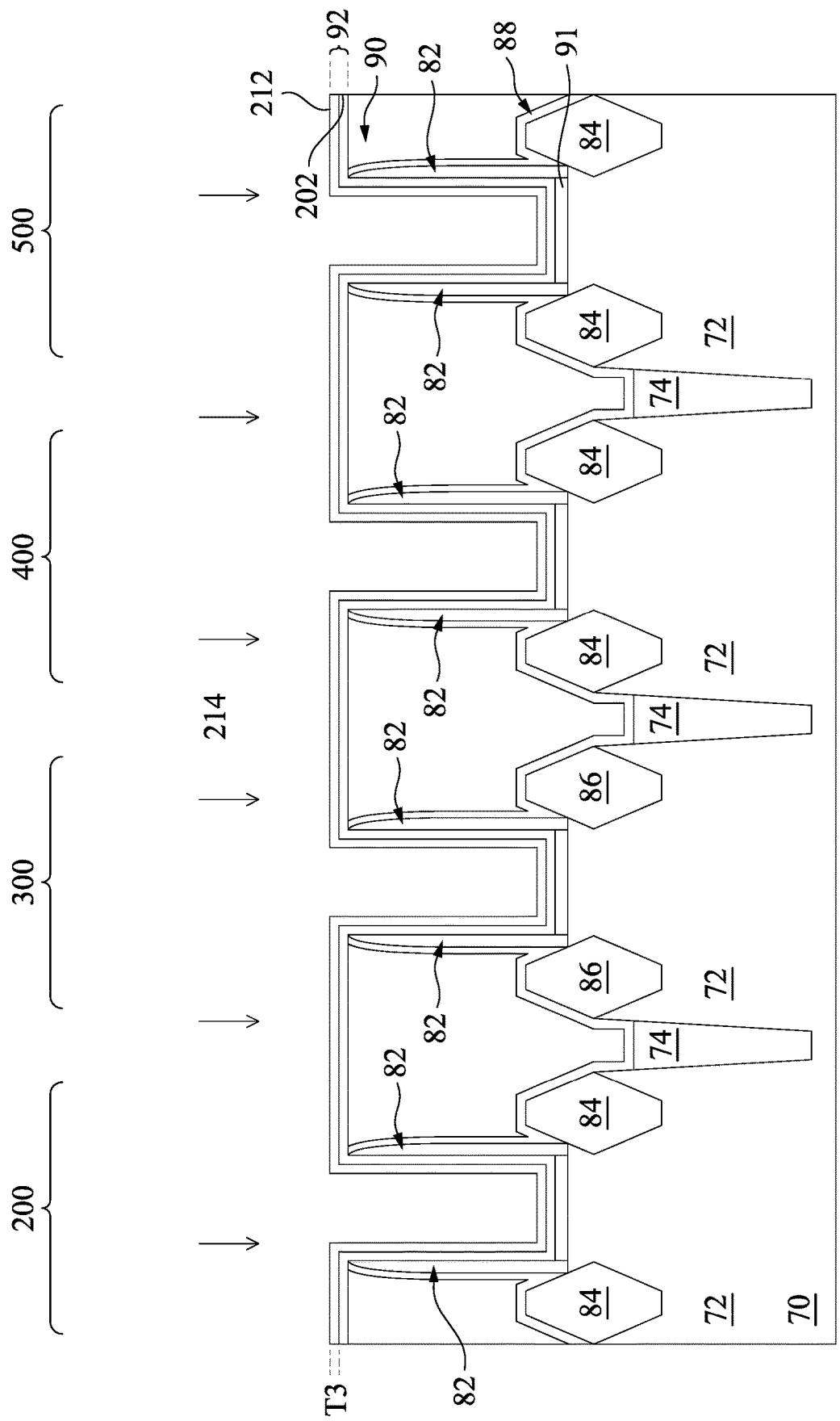

FIG. 14 illustrates the deposition of a second high-k dielectric layer 212 and a second anneal process 214 in accordance with some embodiments. It is appreciated that some of the materials and the process details may be the same as the preceding processes shown in FIG. 8. These details are not repeated, and may be found referring to the description of the preceding processes.

Referring to FIG. 14, the second high-k dielectric layer 212 is deposited. The material of the second high-k dielectric layer 212 may be selected from the same group of candidate materials for forming the first high-k dielectric layer 202 (FIG. 8), and may include $HfO_2$, $ZrO_2$, $TiO_2$, or the like, or the combinations thereof such as HfZrO, HfTiO, or the like. The second high-k dielectric layer 212 is overlying, and may contact the underlying first high-k dielectric layer 202. In accordance with some embodiments of the present disclosure, the first and second high-k dielectric layers 202 and 212 are formed using ALD or CVD. The deposition temperature may be in the range between about 200° C. and about 400° C. The thickness T3 of the second high-k dielectric layer 212 may be equal to or smaller than the thickness T1 of the underlying first high-k dielectric layer 202. For example, thickness T3 may be in the range between about 1 nm and about 2 nm. The combination of the first high-k dielectric layer 202 and the second high-k dielectric layer 212 may be referred to as the gate dielectric layer 92 hereinafter.

Further referring to FIG. 14, the second anneal process 214 is performed. The second anneal process 214 is similar to the first anneal process 203 in FIG. 8, and thus the details are not repeated herein. The second anneal process 214 is used to increase the crystallinity percentage of the first high-k dielectric layer 202 and the second high-k dielectric layer 212. For example, the second anneal process 214 may further crystallize the first high-k dielectric layer 202.

Figure 15:
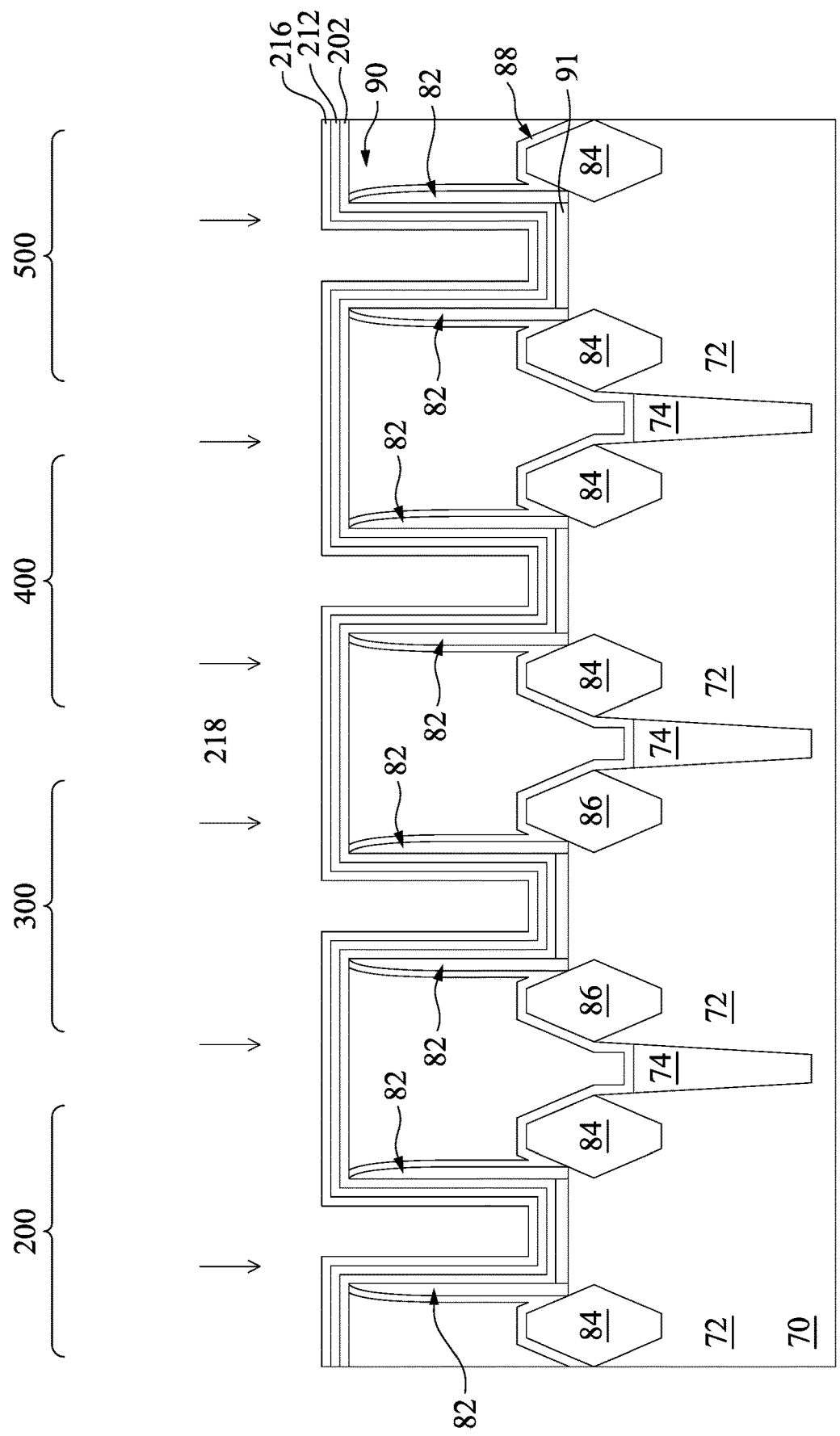

In FIG. 15, a second capping layer 216 may be deposited conformally over the second high-k dielectric layer 212. The second capping layer 216 may comprise a single layer or a plurality of layers deposited by ALD, CVD, PECVD, physical vapor deposition (PVD), or the like. The second capping layer 216 may comprise titanium silicon nitride (TSN), titanium nitride (TiN), amorphous silicon, or the like. After deposition, one or more annealing process 218 may be performed at a temperature that may be in a range from about 600° C. to about 1000° C.

Figure 16:
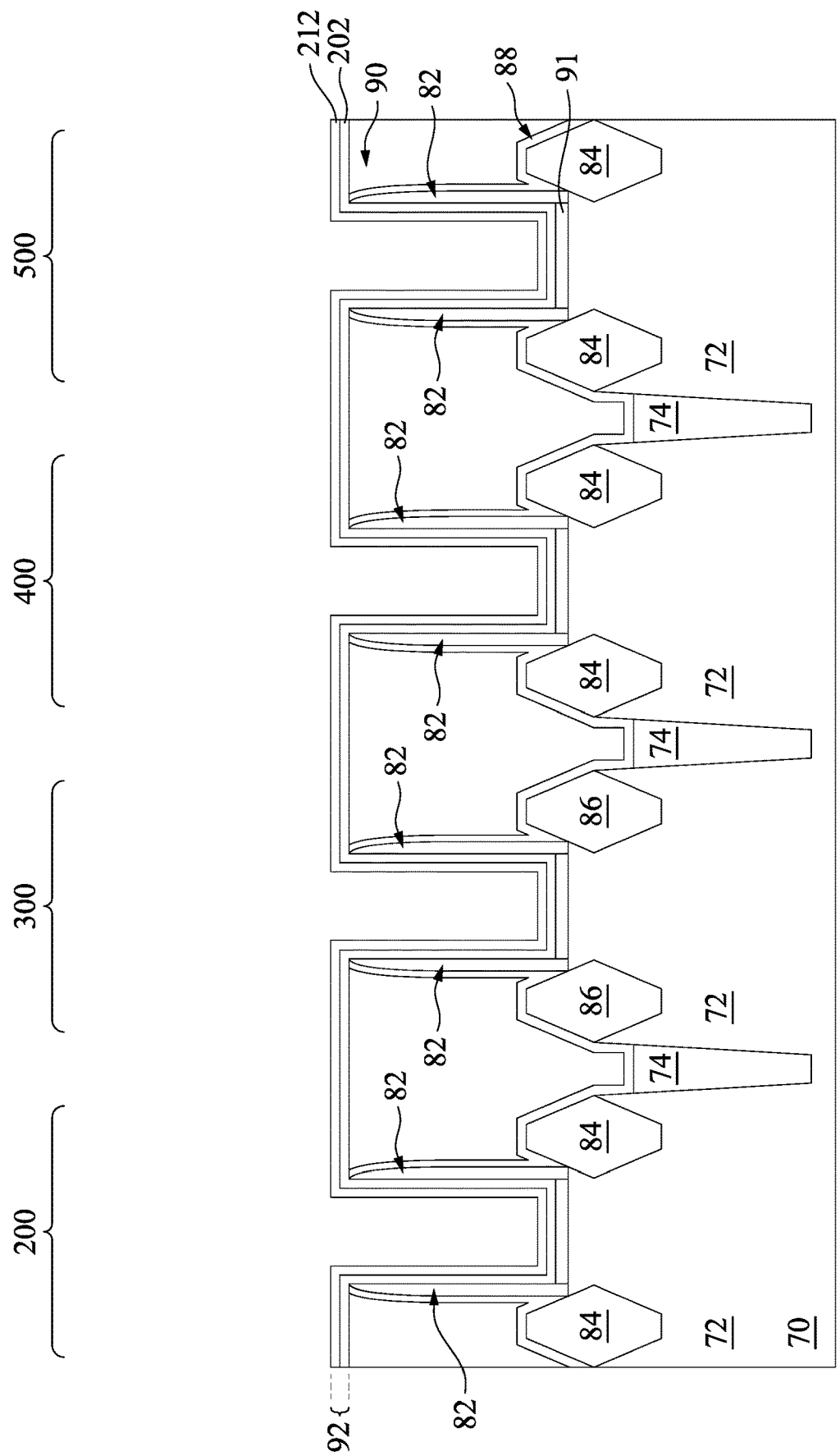

In FIG. 16, the second capping layer 216 is removed using appropriate methods. The second capping layer 216 may be removed using a dry etching process, a wet etching process, or the like.

Advantages can be achieved as a result of depositing a first portion of the gate dielectric layer 92 along sidewalls and over a top surface of a fin and performing the first anneal process 203 followed by depositing a second portion of the gate dielectric layer 92 over the first portion of the gate dielectric layer 92 and subsequently performing the second anneal process 214. These advantages may include crystallizing the gate dielectric layer 92 such that the percent crystallinity of the gate dielectric layer 92 (e.g., the overall combined and/or individual crystallinity of the first high-k dielectric layer 202 and the second high-k dielectric layer 212) is higher than 70 percent. The crystallization of the gate dielectric layer 92 leads to the densifying and consequently the strengthening of the gate dielectric layer 92. For example, a crystallization of the gate dielectric layer 92 that is higher than 70 percent results in a stronger gate dielectric layer 92 that is able to resist gate dielectric loss during subsequent metal gate patterning processes when the gate dielectric layer 92 is used as an etch stop. In this way the gate dielectric layer 92 loss during the subsequent metal gate patterning processes may be reduced by as much as 0.2 nm. In addition, the use of the first anneal process 203 and the second anneal process 214 results in reduced dopant diffusion at junctions, and allows for the use of higher annealing peak temperatures in a range from about 1000° C. to about 1150° C. while having reduced drain induced barrier lowering effects. Accordingly, the risk of performance degradation is lowered.

Figure 17:
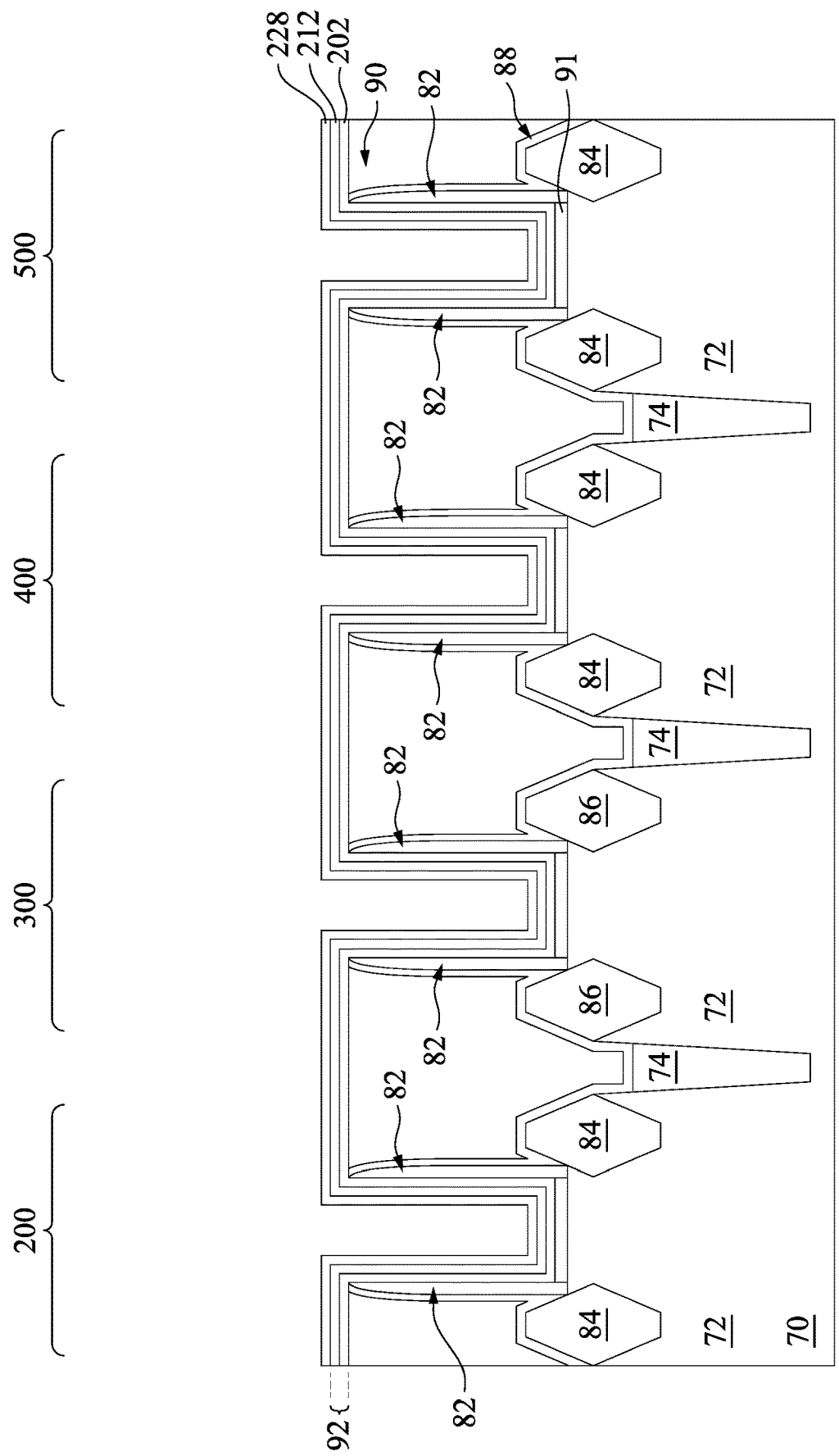

In FIG. 17, a first work function tuning layer 228 is then formed conformally on the gate dielectric layer 92. The first work function tuning layer 228 may be any acceptable material to tune a work function of a device to a desired amount given the application of the device to be formed, and may be deposited using any acceptable deposition process. In some embodiments, the first work function tuning layer 228 is an n-type work function metal and may comprise titanium aluminum nitride (TiAlN), titanium aluminum carbide (TiAlC, TiAl), or the like deposited by ALD, CVD, PVD, or the like.

Figure 18:
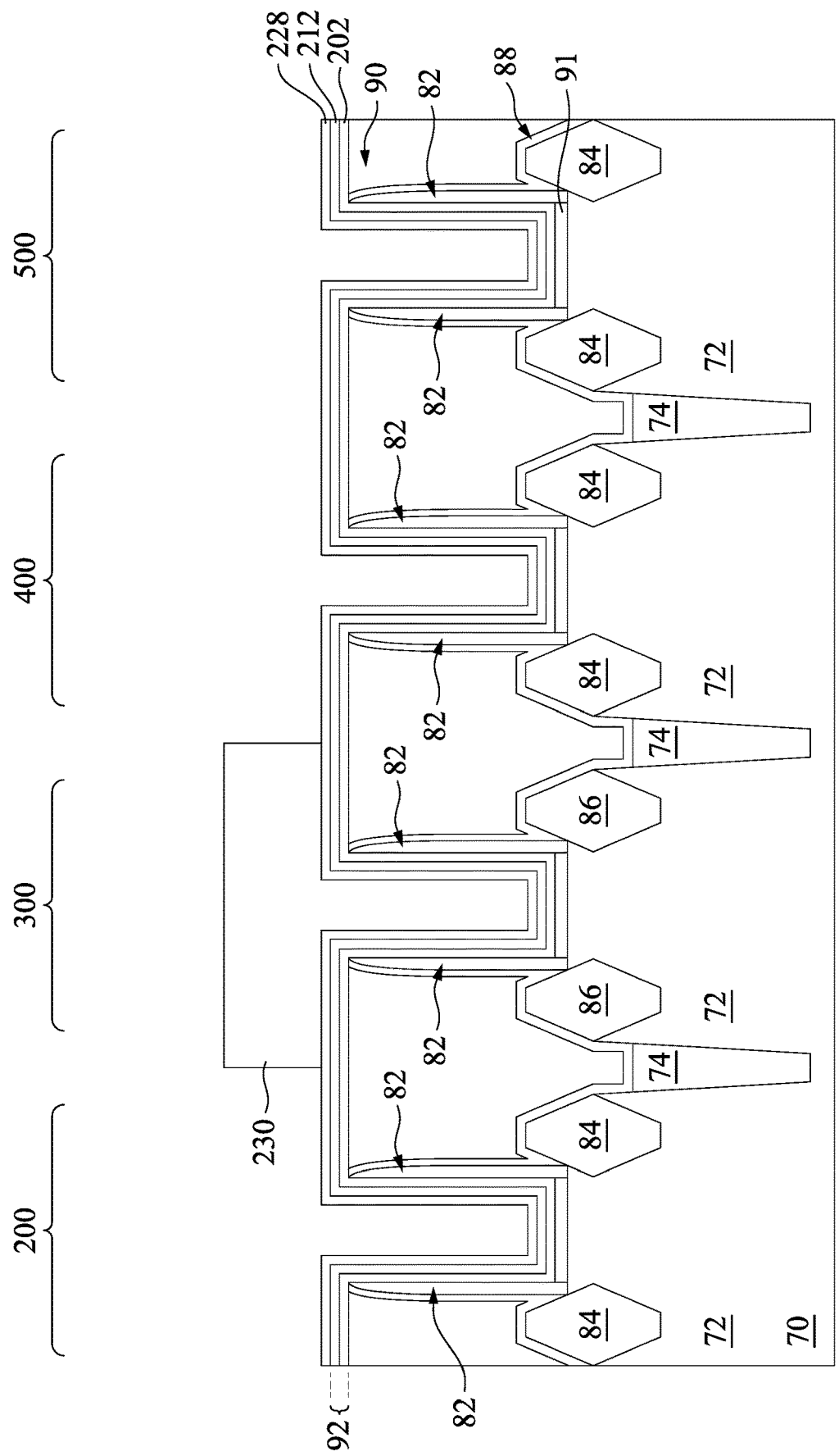

In FIG. 18, a mask 230 is then deposited and patterned over the first work function tuning layer 228. The mask layer 230 may cover the first work function tuning layer 228 in the second region 300, while exposing the first work function tuning layer 228 in the first region 200, the third region 400, and the fifth region 500. In some embodiments, the mask 230 is a photoresist formed by using a spin-on technique and can be patterned using acceptable photolithography techniques.

Figure 19:
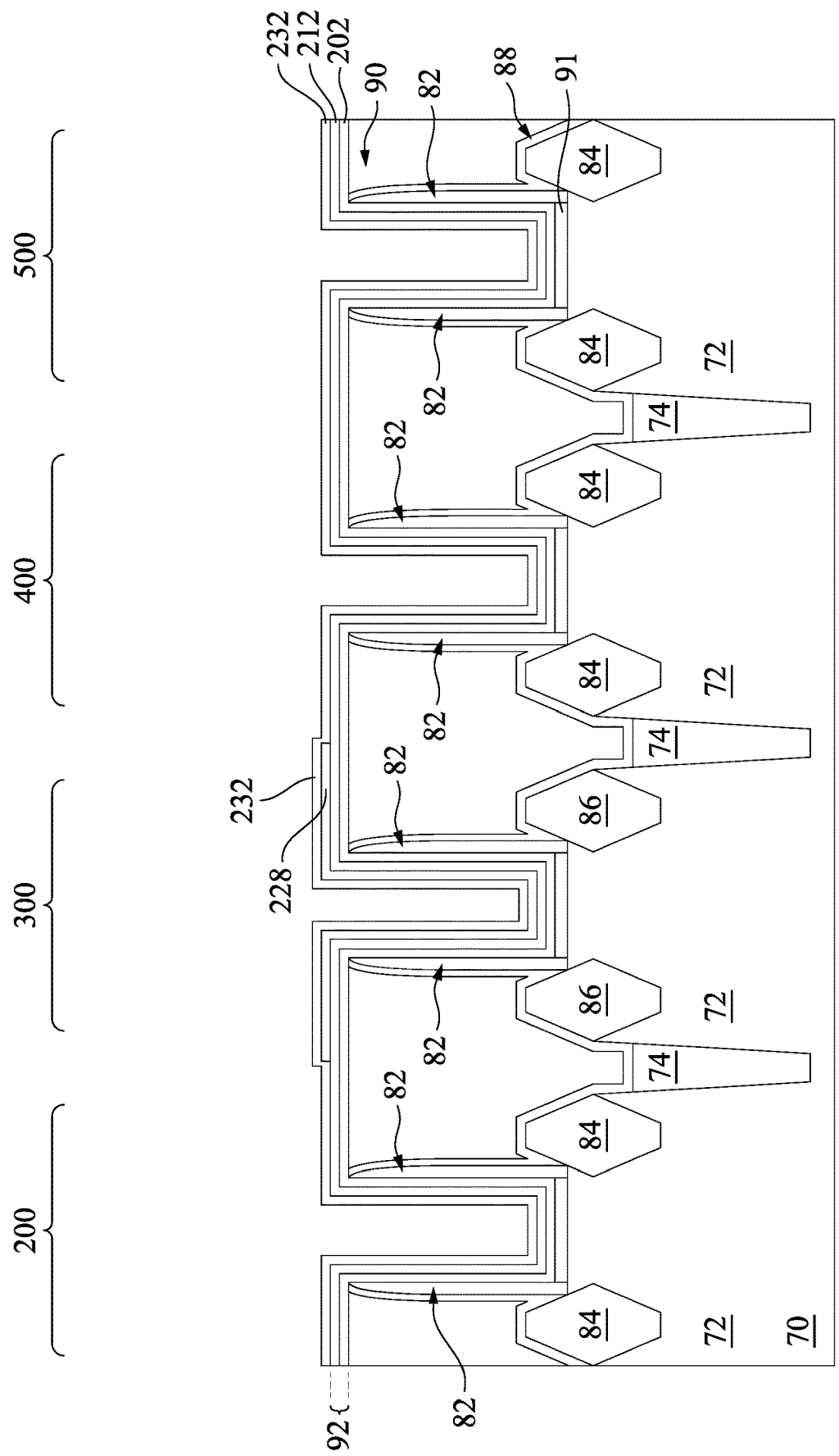

In FIG. 19, after the mask 230 is patterned, an etch selective to the first work function tuning layer 228 is performed to remove the first work function tuning layer 228 from the first region 200, the third region 400, and the fourth region 500. The gate dielectric layer 92 in the first region 200, the third region 400, and the fourth region 500 may act as an etch stop during this etching. As a result of the first anneal process 203 (described previously in FIG. 8) and the second anneal process 214 (described previously in FIG. 14), the gate dielectric layer 92 is strengthened and is able to better resist gate dielectric loss when the etch selective to the first work function tuning layer 228 is performed.

The mask 230 is then removed, such as by using an appropriate wet strip and/or ashing process if the mask 230 is a photoresist. Next, a second work function tuning layer 232 is then formed conformally on the gate dielectric layer 92 in the first region 200, the third region 400, and the fifth region 500 and conformally on the first work function tuning layer 228 in the second region 300. The second work function tuning layer 232 may be any acceptable material to tune a work function of a device to a desired amount given the application of the device to be formed, and may be deposited using any acceptable deposition process. In some embodiments, the second work function tuning layer 232 is a p-type work function metal and may comprise titanium nitride (TiN, TaN) or the like deposited by ALD, CVD, PVD, or the like.

Figure 20:
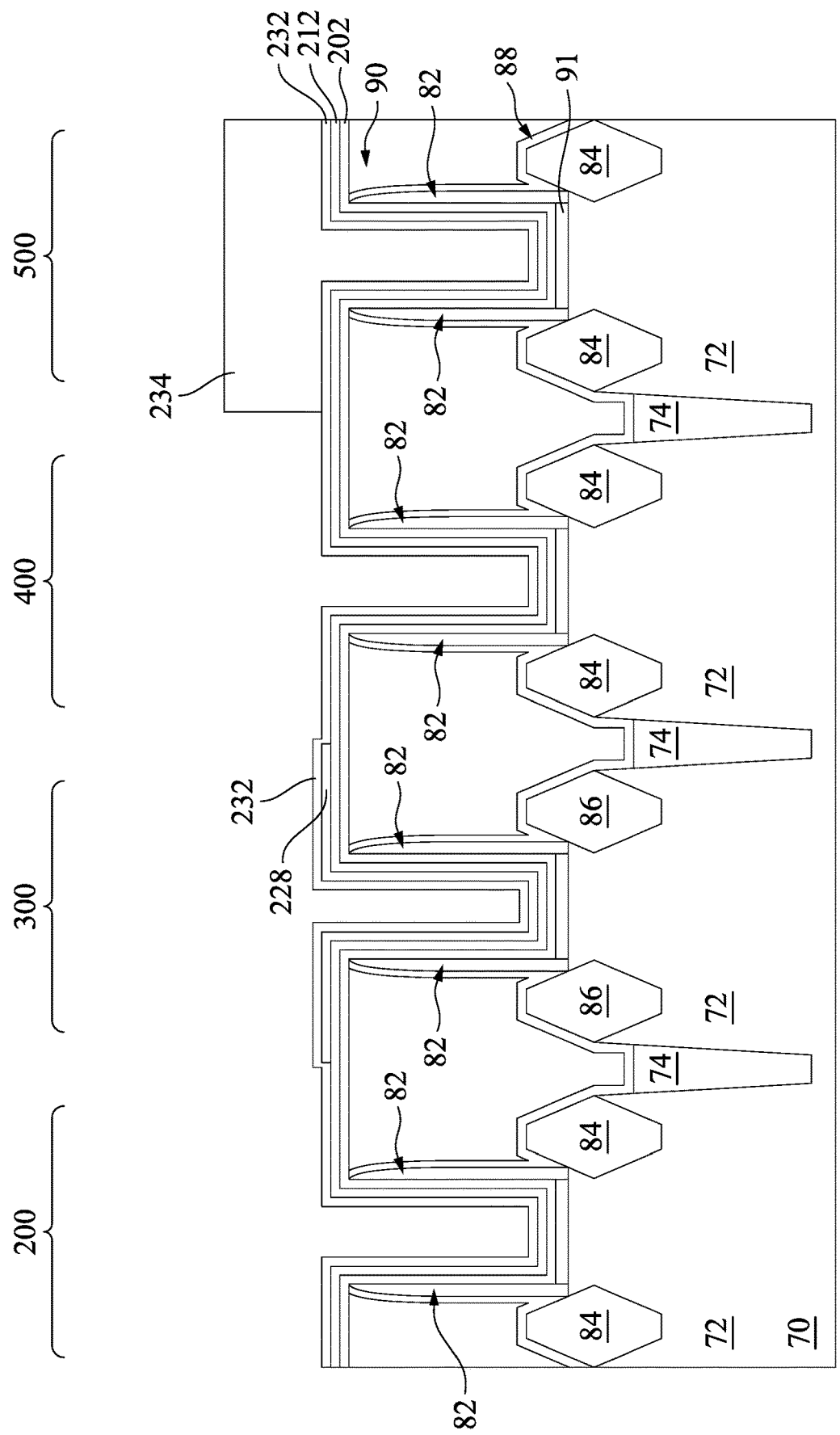

In FIG. 20, a mask 234 is then deposited and patterned over the second work function tuning layer 232. The mask layer 234 may cover the second work function tuning layer 232 in the fourth region 500, while exposing the second work function tuning layer 232 in the first region 200, the second region 300, and the third region 400. In some embodiments, the mask 234 is a photoresist formed by using a spin-on technique and can be patterned using acceptable photolithography techniques.

Figure 21:
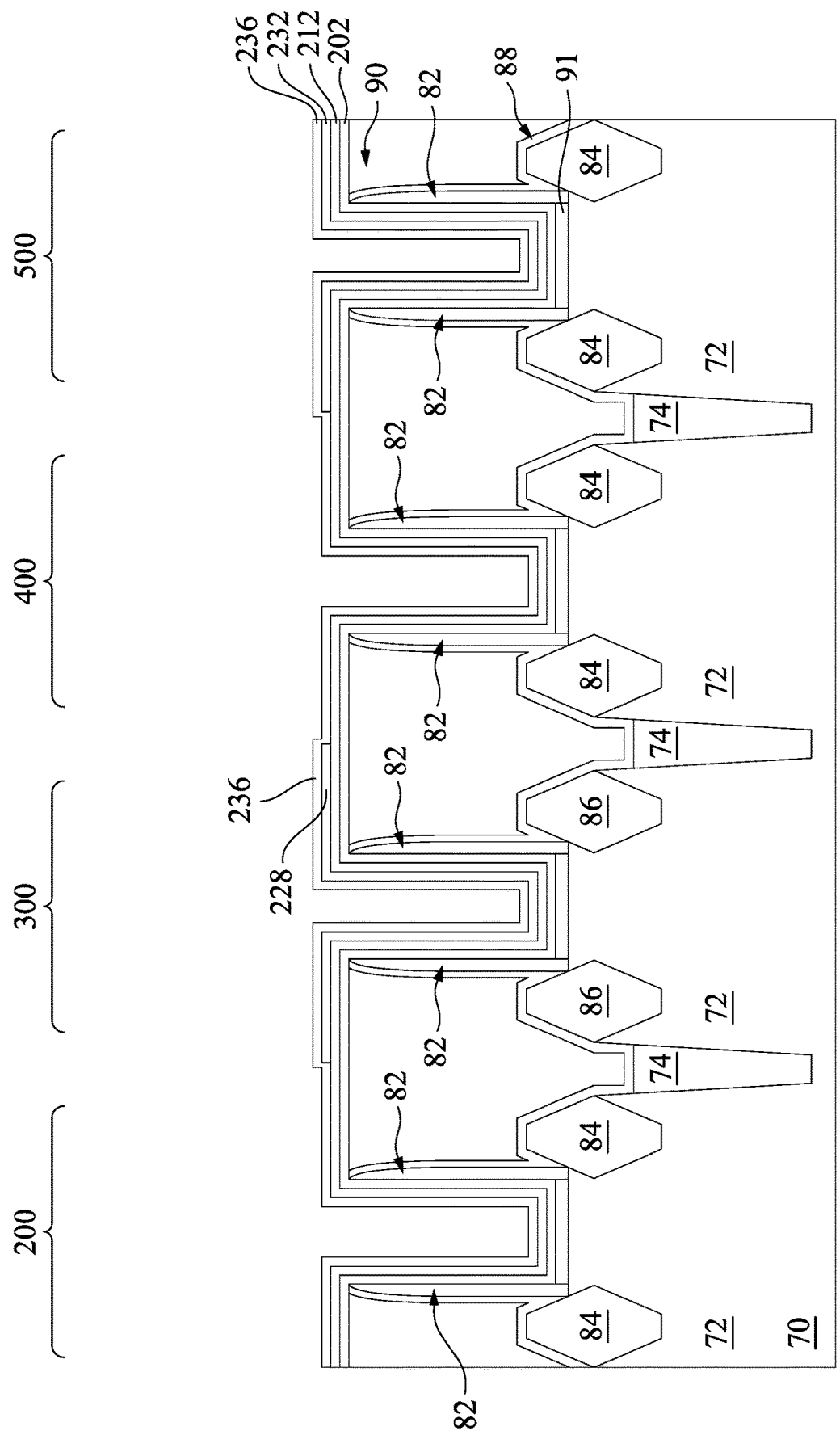

In FIG. 21, after the mask 234 is patterned, an etch selective to the second work function tuning layer 232 is performed to remove the second work function tuning layer 232 from the first region 200, the second region 300, and the third region 400. In some embodiments, a timed and/or selective etching process may be performed so that only the second work function tuning layer 232 is substantially removed in the first, second and third regions 200, 300, and 400 without significantly removing the underlying layers (e.g., the gate dielectric layer 92 and the first work function tuning layer 228) in these regions. As a result of the first anneal process 203 (described previously in FIG. 8) and the second anneal process 214 (described previously in FIG. 14), the gate dielectric layer 92 is strengthened and is able to better resist gate dielectric loss when the etch selective to the second work function tuning layer 232 is performed. The mask 234 is then removed, such as by using an appropriate wet strip and/or ashing process if the mask 234 is a photoresist. Next, a third work function tuning layer 236 is then formed conformally on the gate dielectric layer 92 in the first region 200 and the third region 400, and conformally on the first work function tuning layer 228 in the second region 300 and the second work function tuning layer 232 in the fourth region 500. The third work function tuning layer 236 may be any acceptable material to tune a work function of a device to a desired amount given the application of the device to be formed, and may be deposited using any acceptable deposition process. In some embodiments, the third work function tuning layer 236 is a p-type work function metal and may comprise titanium nitride (TiN) or the like deposited by ALD, CVD, PVD, or the like.

Figure 22:
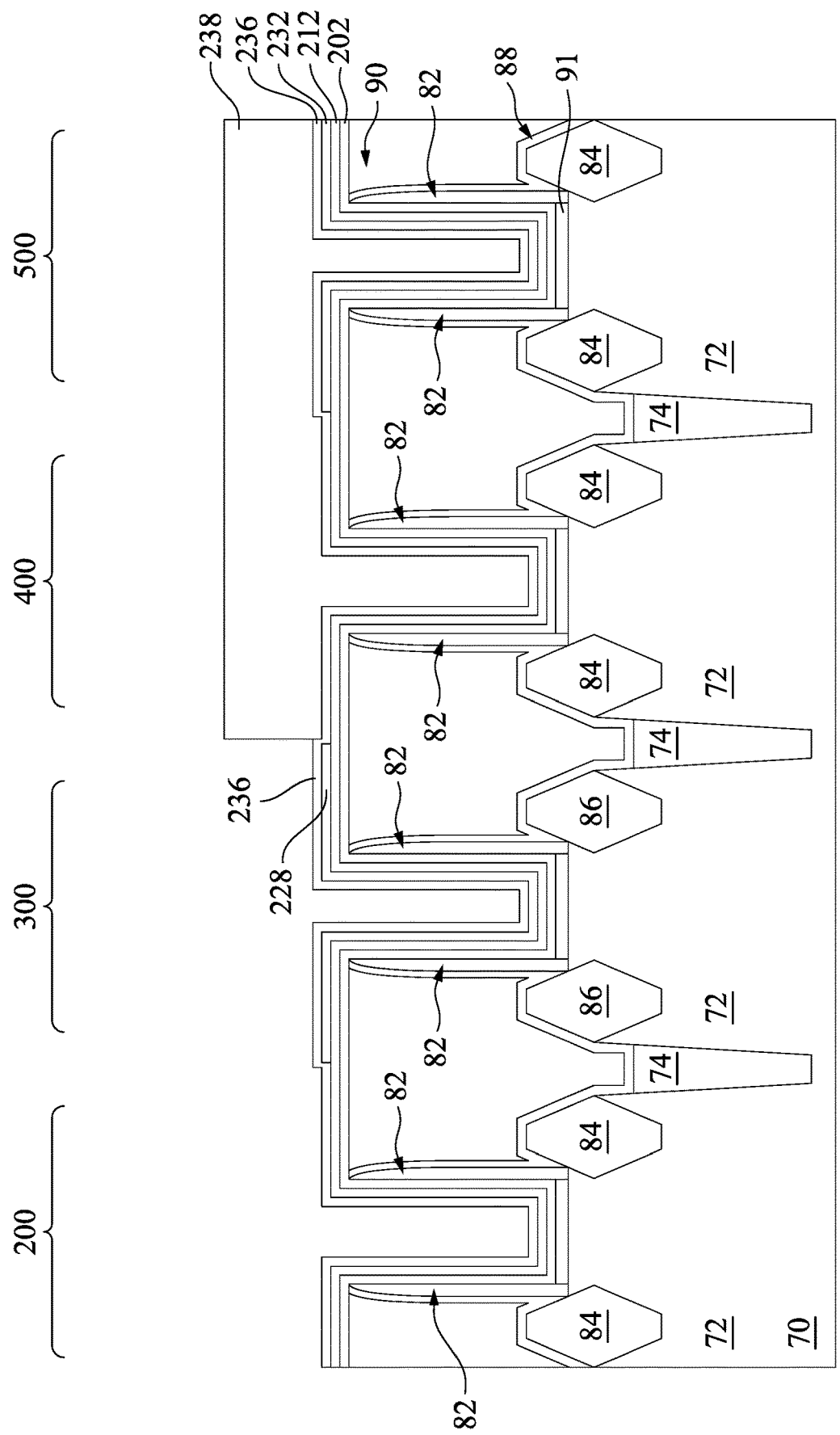

In FIG. 22, a mask 238 is then deposited and patterned over the third work function tuning layer 236. The mask layer 238 may cover the third work function tuning layer 236 in the third region 400 and the fourth region 500, while exposing the third work function tuning layer 236 in the first region 200 and the second region 300. In some embodiments, the mask 238 is a photoresist formed by using a spin-on technique and can be patterned using acceptable photolithography techniques.

Figure 23:
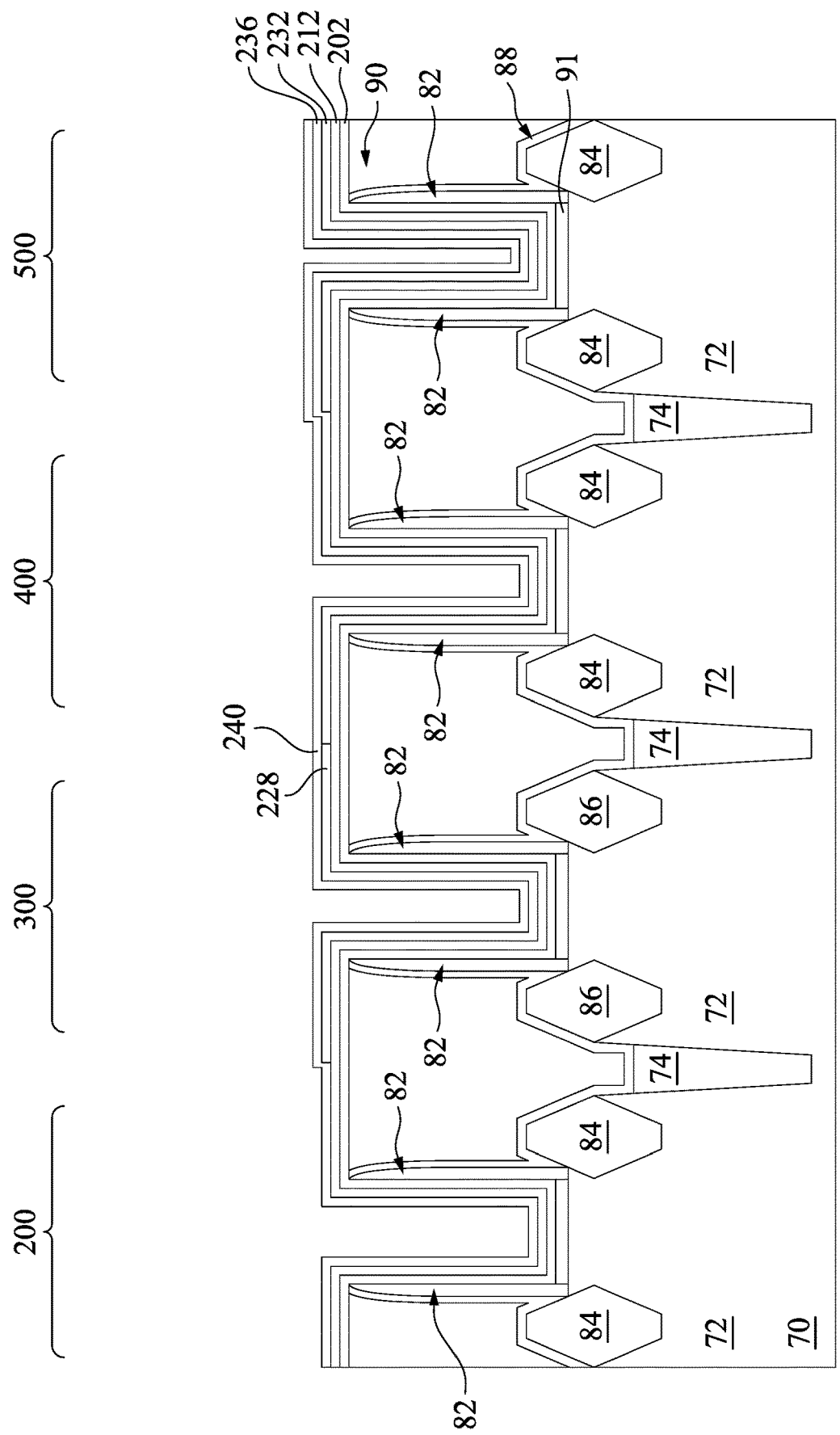

In FIG. 23, after the mask 238 is patterned, an etch selective to the third work function tuning layer 236 is performed to remove the third work function tuning layer 236 from the first region 200 and the second region 300. In some embodiments, a timed and/or selective etching process may be performed so that only the third work function tuning layer 236 is substantially removed in the first region 200 and the second region 300 without significantly removing the underlying layers (e.g., the gate dielectric layer 92 and the first work function tuning layer 228) in these regions. As a result of the first anneal process 203 (described previously in FIG. 8) and the second anneal process 214 (described previously in FIG. 14), the gate dielectric layer 92 is strengthened and is able to better resist gate dielectric loss when the etch selective to the third work function tuning layer 236 is performed. The mask 238 is then removed, such as by using an appropriate wet strip and/or ashing process if the mask 238 is a photoresist. Next, a fourth work function tuning layer 240 is then formed conformally on the gate dielectric layer 92 in the first region 200, the first work function tuning layer 228 in the second region 300, and the third work function tuning layer 236 in the third region 400 and fourth region 500. The fourth work function tuning layer 240 may be any acceptable material to tune a work function of a device to a desired amount given the application of the device to be formed, and may be deposited using any acceptable deposition process. In some embodiments, the fourth work function tuning layer 240 is a p-type work function metal and may comprise titanium nitride (TiN) or the like deposited by ALD, CVD, PVD, or the like.

By using the processes described in FIGS. 19 through 23, one or more of the p-type work function tuning layers may be formed in each of regions 200, 300, 400, and 500 to a desired cumulative thickness (e.g., a thickness of the second work function tuning layer 232, the third work function tuning layer 236 and/or the fourth work function tuning layer 240 in each opening), and transistors with different threshold voltages may be formed in each of the regions 200, 300, 400, and 500.

Figure 24:
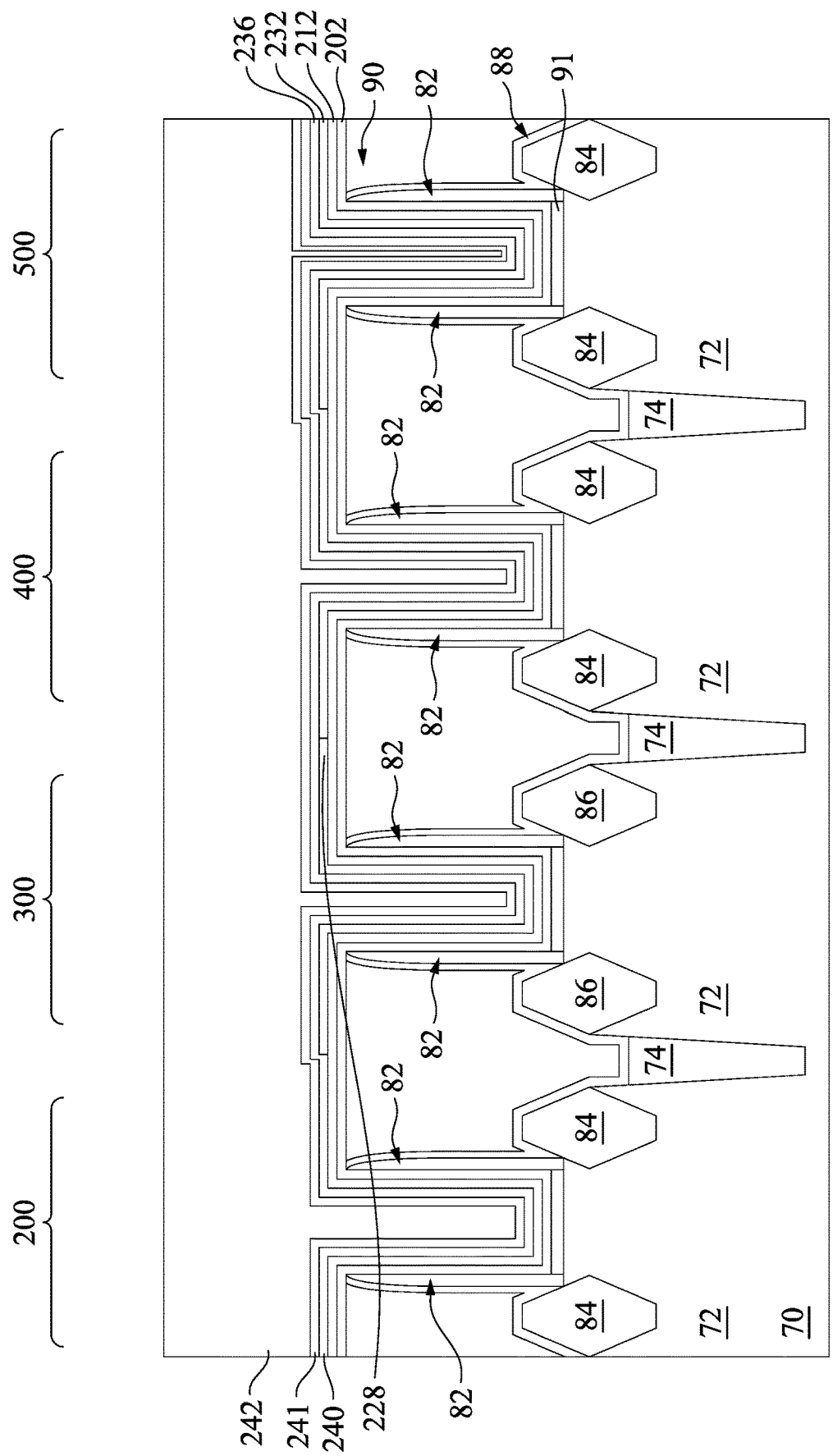

In FIG. 24, an adhesion or glue layer 241 may be formed conformally on the fourth work function tuning layer 240 in first, second, third and fourth regions 200, 300, 400 and 500. The glue layer 241 may comprise titanium nitride (TiN) or the like deposited by ALD or the like. A thickness of the glue layer may be in a range from about 2 nm to about 4 nm. The glue layer 241 is not shown in subsequent figures.

Also in FIG. 24, a conductive material 242 is deposited on the glue layer 241. The conductive material 242 can include a metal, such as tungsten (W), aluminum (Al), cobalt (Co), ruthenium (Ru), combinations thereof or the like. The conductive material 242 can be deposited using CVD, PVD, the like, or a combination thereof. The conductive material 242 at least fills the remaining portions, e.g., portions not filled by the gate dielectric layer 92, the first work function tuning layer 228, the second work function tuning layer 232, the third work function tuning layer 236, the fourth work function tuning layer 240, and the glue layer 241, of the openings.

Figure 25:
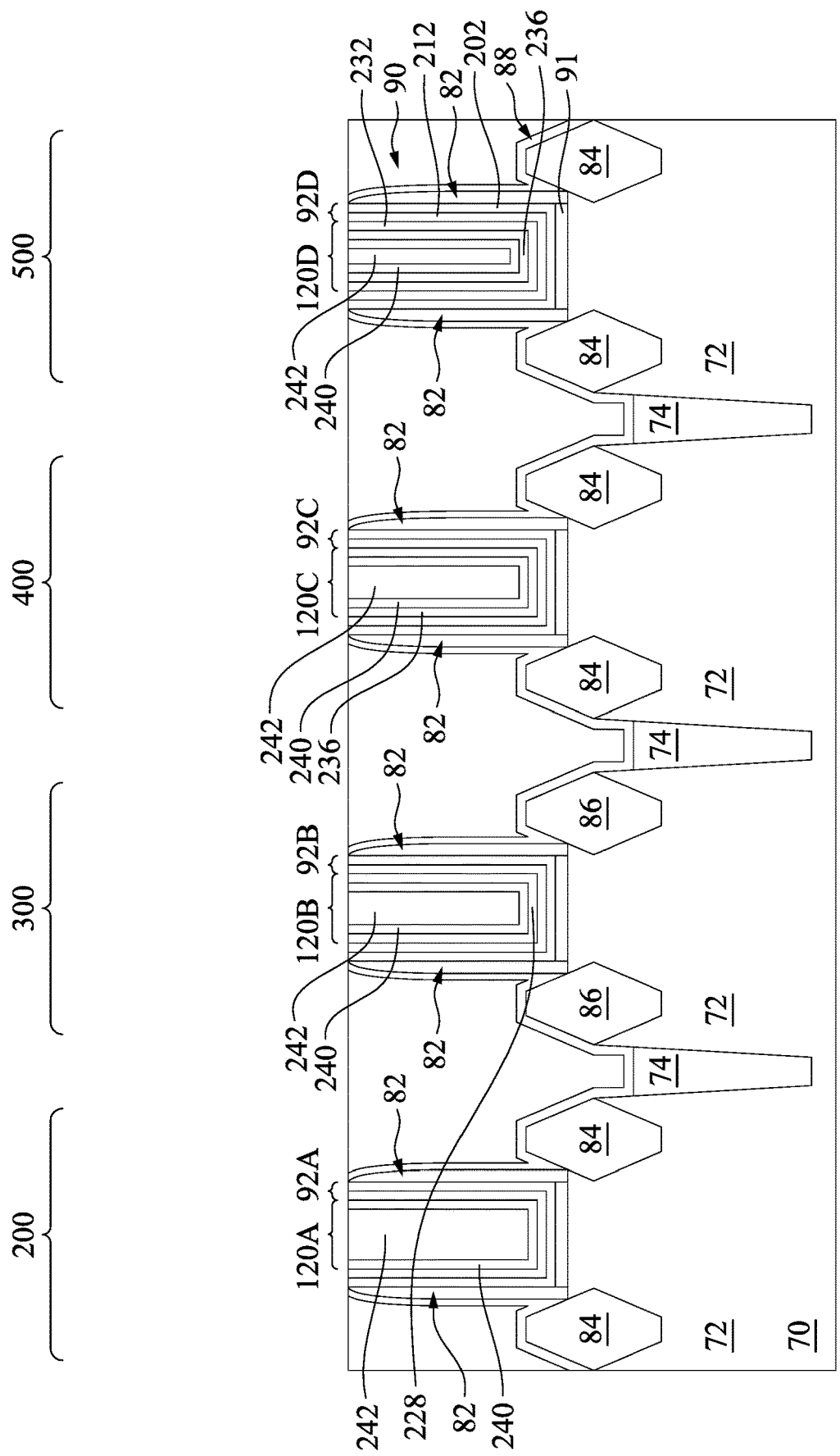

In FIG. 25, a planarization process, such as a CMP, may be performed to remove the excess portions of the gate dielectric layer 92, the first work function tuning layer 228, the second work function tuning layer 232, the third work function tuning layer 236, the fourth work function tuning layer 240, the glue layer 241, and the conductive material 242, which excess portions are over the top surface of ILD 90, to form gate dielectric materials 92A, 92B, 92C, and 92D (e.g., from remaining portions of the gate dielectric layer 92) and gate electrodes 120A, 120B, 120C, and 120D (comprising remaining portions of the first work function tuning layer 228, the second work function tuning layer 232, the third work function tuning layer 236, the fourth work function tuning layer 240, the glue layer 241, and the conductive material 242). Specifically, the first gate electrode 120A in the first region 200 comprises the fourth work function tuning metal 240, the glue layer 241, and the conductive material 242. The second gate electrode 120B in the second region 300 comprises the first work function tuning metal 228, the fourth work function tuning metal 240, the glue layer 241, and the conductive material 242. The third gate electrode 120C in the third region 400 comprises the third work function tuning metal 236, the fourth work function tuning metal 240, the glue layer 241, and the conductive material 242. The fourth gate electrode 120D in the fourth region 500 comprises the second work function tuning metal 232, the third work function tuning metal 236, the fourth work function tuning metal 240, the glue layer 241, and the conductive material 242. For ease of reference, the gate electrodes 120A, 120B, 120C, and 120D may be referred to as gate electrodes 120 hereinafter.

Figure 26A:
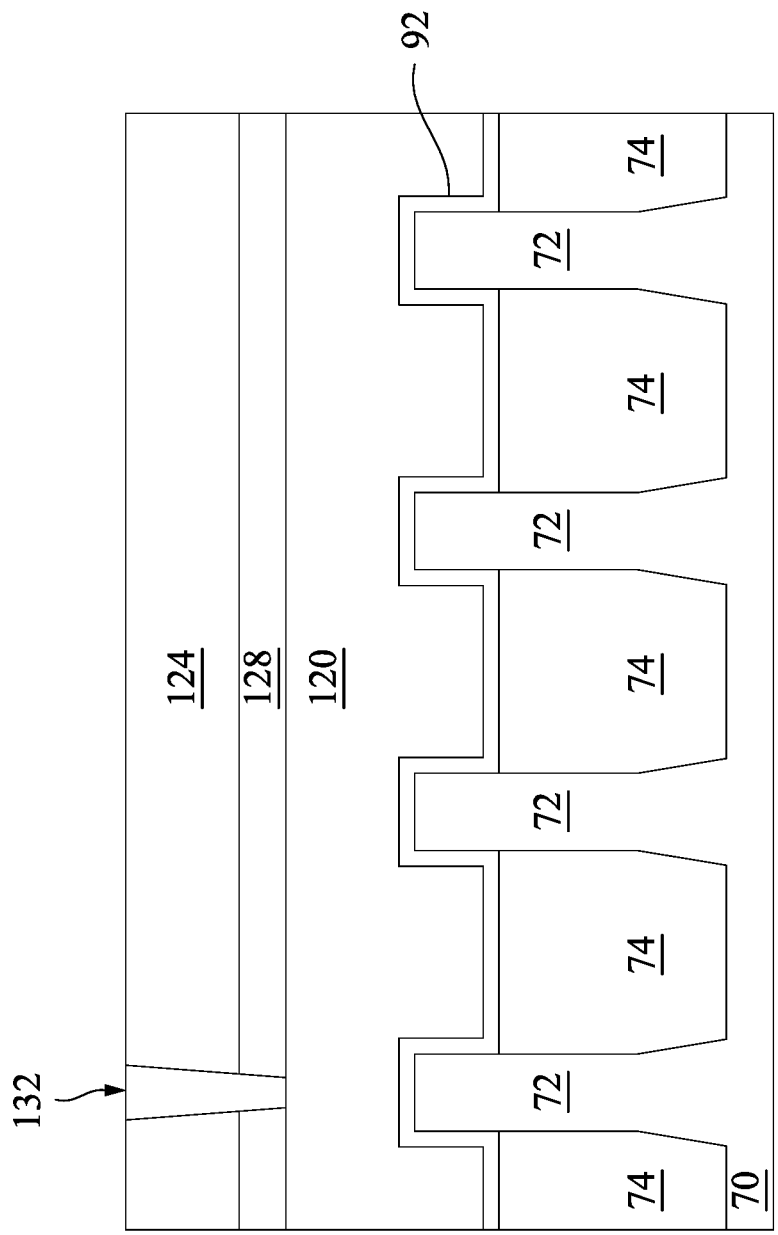
Figure 26B:
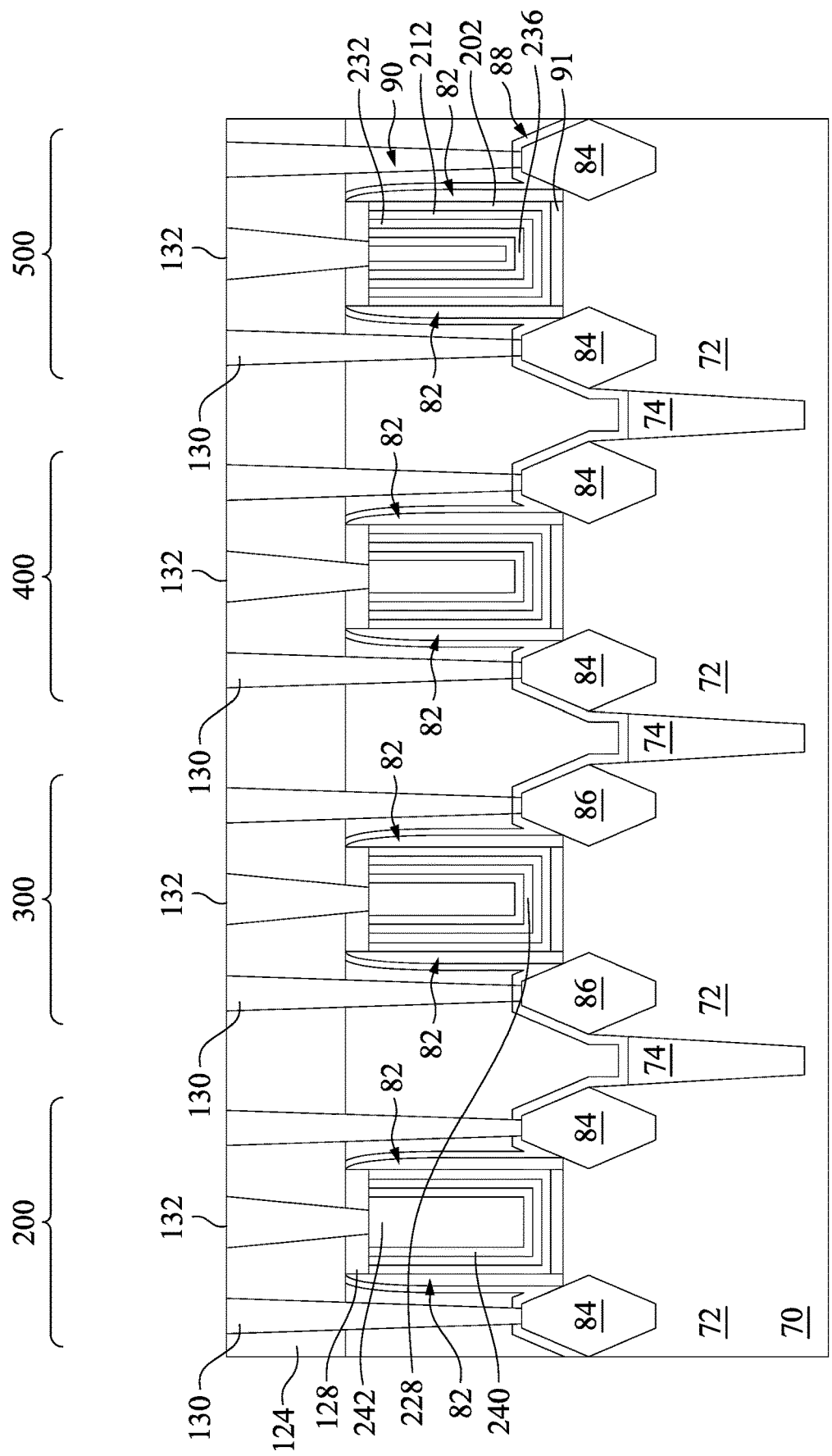
Figure 26C:
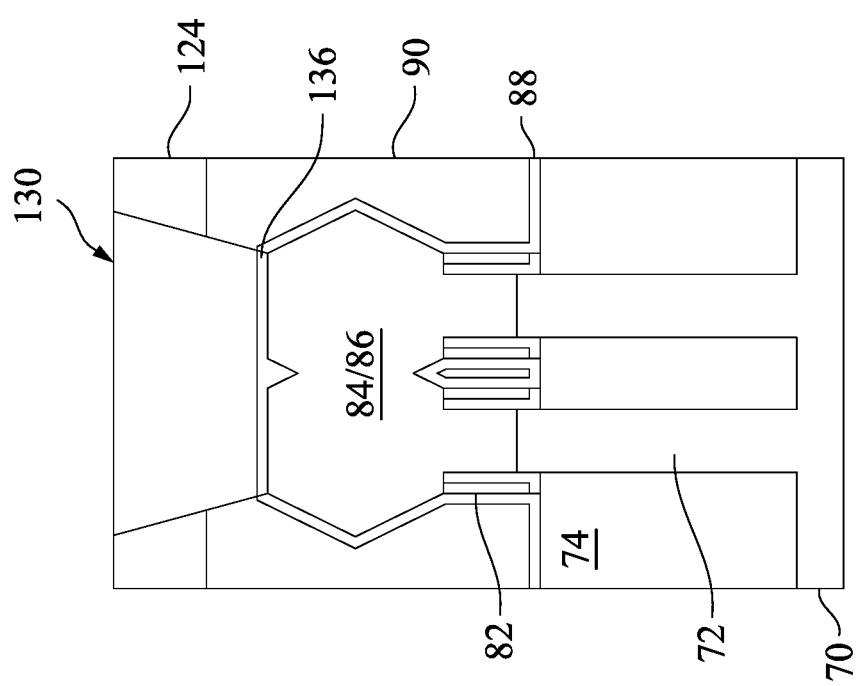

In FIGS. 26A, 26B, and 26C, a gate mask 128 is formed over each gate stack (including the gate dielectric layer 92 and the corresponding gate electrodes 120), and the gate mask 128 may be disposed between opposing portions of the gate spacers 82. In some embodiments, forming the gate mask 128 includes recessing the gate stack so that a recess is formed directly over the gate stack and between opposing portions of gate spacers 82. A gate mask 128 comprising one or more layers of dielectric material, such as silicon nitride, silicon oxynitride, or the like, is filled in the recess, followed by a planarization process to remove excess portions of the dielectric material extending over the first ILD 90.

As also illustrated in FIGS. 26A, 26B, and 26C, a second ILD 124 is deposited over the ILD 90. In some embodiments, the second ILD 124 is a flowable film formed by a flowable CVD method. In some embodiments, the second ILD 124 is formed of a dielectric material such as PSG, BSG, BPSG, USG, or the like, and may be deposited by any suitable method, such as CVD and PECVD.

Gate contacts 132 and source/drain contacts 130 are formed through the second ILD 124 and the ILD 90 in accordance with some embodiments. Openings for the source/drain contacts 130 are formed through the ILDs 90 and 124, and openings for the gate contact 132 are formed through the ILD 124 and the gate mask 128. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 124. The remaining liner and conductive material form the source/drain contacts 130 and gate contacts 132 in the openings. An anneal process may be performed to form a silicide 136 at the interface between the epitaxial source/drain regions 84/86 and the source/drain contacts 130. The source/drain contacts 130 are physically and electrically coupled to the epitaxial source/drain regions 84/86, and the gate contacts 132 are physically and electrically coupled to the gate electrodes 120. The source/drain contacts 130 and gate contacts 132 may be formed in different processes, or may be formed in the same process. Although shown as being formed in the same cross-sections, it should be appreciated that each of the source/drain contacts 130 and gate contacts 132 may be formed in different cross-sections, which may avoid shorting of the contacts.

Various embodiments include methods applied to, but not limited to depositing a gate dielectric layer along sidewalls and over a top surface of a fin and performing one or more annealing processes on the gate dielectric layer. The annealing processes may be carried out at temperatures in a range from about 1000° C. to about 1150° C. As a result, the gate dielectric layer is highly crystallized and hence strengthened leading to less gate dielectric loss during subsequent metal gate patterning processes when the gate dielectric layer is used as an etch stop. In addition, the use of microsecond annealing processes results in reduced dopant diffusion at junctions, and allows for the use of higher annealing peak temperatures while having reduced drain induced barrier lowering effects. Accordingly, the risk of performance degradation is lowered.

In accordance with an embodiment, a method for forming a gate electrode includes depositing a first high-k dielectric layer over a first semiconductor region; performing a first annealing process on the first high-k dielectric layer; depositing a second high-k dielectric layer over the first high-k dielectric layer; and performing a second annealing process on the first high-k dielectric layer and the second high-k dielectric layer. In an embodiment, a first thickness of the first high-k dielectric layer is larger than a second thickness of the second high-k dielectric layer. In an embodiment, the first annealing process and the second annealing process are the same. In an embodiment, during the performing the first annealing process and the second annealing process the temperature is ramped up to a first temperature that is in a range from 1000° C. to 1150° C. In an embodiment, during the performing the first annealing process and the second annealing process the first temperature is maintained for a duration from 1 ms to 30 ms. In an embodiment, after performing the first annealing process and the second annealing process the first high-k dielectric layer and the second high-k dielectric layer have a combined crystallinity that is higher than 70 percent. In an embodiment, the first annealing process and the second annealing process are performed in an ambient environment that includes nitrogen, argon, or a mixture thereof. In an embodiment, the method further includes depositing a first work function tuning layer over the second high-k dielectric layer; selectively removing the first work function tuning layer from over a first, a third, and a fourth portion of the first semiconductor region; depositing a second work function tuning layer over the first work function tuning layer and the second high-k dielectric layer; selectively removing the second work function tuning layer from over the first, a second, and the third portion of the first semiconductor region; depositing a third work function tuning layer over the first work function tuning layer, the second work function tuning layer, and the second high-k dielectric layer; selectively removing the third work function tuning layer from over the first and the second portion of the first semiconductor region; and depositing a fourth work function tuning layer over the first work function tuning layer, the third work function tuning layer, and the second high-k dielectric layer. In an embodiment, the first work function tuning layer includes an n-type layer and the second work function tuning layer, the third work function tuning layer and the fourth work function tuning layer includes a p-type layer.

In accordance with an embodiment, a method for forming a gate electrode includes depositing a first high-k dielectric layer over a first semiconductor region; performing a first annealing process on the first high-k dielectric layer; depositing a second high-k dielectric layer over the first high-k dielectric layer; performing a second annealing process on the first high-k dielectric layer and the second high-k dielectric layer, where after the second annealing process the combined crystallinity of the first high-k dielectric layer and the second high-k dielectric layer is higher than 70 percent. In an embodiment, each of the first annealing process and the second annealing process includes a preheat at a temperature that is in a range from 400° C. to 750° C. In an embodiment, the first annealing process and the second annealing process are microsecond anneals (μSSA). In an embodiment, during the first annealing process and the second annealing process the temperature is ramped up to a maximum temperature that is in a range from about 1000° C. to about 1150° C. In an embodiment, during the first annealing process and the second annealing process the maximum temperature is maintained for a duration that is in a range from 1 ms to 30 ms. In an embodiment, each of the first annealing process and the second annealing process, a post heat temperature is maintained that is in a range from 500° C. to 700° C.

In accordance with an embodiment, a device includes a first gate electrode, the first gate electrode including a first high-k dielectric layer; a first p-type work function tuning metal contacting the first high-k dielectric layer; and a first conductive material over the first p-type work function tuning metal; and a second gate electrode, the second gate electrode including a second high-k dielectric layer; a first n-type work function tuning metal contacting the second high-k dielectric layer; a second p-type work function tuning metal contacting the first n-type work function tuning metal; and a second conductive material over the second p-type work function tuning metal, where the crystallinity of the first high-k dielectric layer and the second high-k dielectric layer is higher than 70 percent. In an embodiment, the device further includes a third gate electrode, the third gate electrode includes a third high-k dielectric layer; a third p-type work function tuning metal contacting the third high-k dielectric layer; a fourth p-type work function tuning metal contacting the third p-type work function tuning metal; and a third conductive material over the fourth p-type work function tuning metal. In an embodiment, the first, the second, the third, and the fourth p-type work function tuning metal includes the same material. In an embodiment, the first, the second, the third, and the fourth p-type work function tuning metal includes titanium nitride and the first n-type work function tuning metal includes titanium aluminum nitride. In an embodiment, a combined thickness of the third p-type work function tuning metal and the fourth p-type work function tuning metal is larger than a thickness of the first p-type work function tuning metal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a gate electrode, the method comprising:
   depositing a first high-k dielectric layer over a first semiconductor region;
   performing a first annealing process on the first high-k dielectric layer;
   depositing a second high-k dielectric layer over the first high-k dielectric layer; and
   performing a second annealing process on the first high-k dielectric layer and the second high-k dielectric layer, wherein after performing the first annealing process and the second annealing process the first high-k dielectric layer and the second high-k dielectric layer have a combined crystallinity that is higher than 70 percent.

2. The method of claim 1, wherein a first thickness of the first high-k dielectric layer is larger than a second thickness of the second high-k dielectric layer.

3. The method of claim 1, wherein the first annealing process and the second annealing process are the same.

4. The method of claim 3, wherein during the performing the first annealing process and the second annealing process the temperature is ramped up to a first temperature that is in a range from 1000° C. to 1150° C.

5. The method of claim 4, wherein during the performing the first annealing process and the second annealing process the first temperature is maintained for a duration from 1 ms to 30 ms.

6. The method of claim 1, wherein the first annealing process and the second annealing process are performed in an ambient environment that comprises nitrogen, argon, or a mixture thereof.

7. The method of claim 1 further comprising:
   depositing a first work function tuning layer over the second high-k dielectric layer;
   selectively removing the first work function tuning layer from over a first, a third, and a fourth portion of the first semiconductor region;
   depositing a second work function tuning layer over the first work function tuning layer and the second high-k dielectric layer;
   selectively removing the second work function tuning layer from over the first, a second, and the third portion of the first semiconductor region;
   depositing a third work function tuning layer over the first work function tuning layer, the second work function tuning layer, and the second high-k dielectric layer;
   selectively removing the third work function tuning layer from over the first and the second portion of the first semiconductor region; and
   depositing a fourth work function tuning layer over the first work function tuning layer, the third work function tuning layer, and the second high-k dielectric layer.

8. The method of claim 7, wherein the first work function tuning layer comprises an n-type layer and the second work function tuning layer, the third work function tuning layer and the fourth work function tuning layer comprises a p-type layer.

9. The method of claim 1, wherein a dielectric constant of the first high-k dielectric layer is higher than 7.0.

10. A method for forming a gate electrode, the method comprising:
    depositing a first high-k dielectric layer over a first semiconductor region;
    performing a first annealing process on the first high-k dielectric layer;
    depositing a second high-k dielectric layer over the first high-k dielectric layer; and
    performing a second annealing process on the first high-k dielectric layer and the second high-k dielectric layer, wherein after the second annealing process the combined crystallinity of the first high-k dielectric layer and the second high-k dielectric layer is higher than 70 percent.

11. The method of claim 10, wherein each of the first annealing process and the second annealing process comprise a preheat at a temperature that is in a range from 400° C. to 750° C.

12. The method of claim 10, wherein the first annealing process and the second annealing process are microsecond anneals (μSSA).

13. The method of claim 10, wherein during the first annealing process and the second annealing process the temperature is ramped up to a maximum temperature that is in a range from about 1000° C. to about 1150° C.

14. The method of claim 13, wherein during the first annealing process and the second annealing process the maximum temperature is maintained for a duration that is in a range from 1 ms to 30 ms.

15. The method of claim 10, wherein after each of the first annealing process and the second annealing process, a post heat temperature is maintained that is in a range from 500° C. to 700° C.

16. A method for forming a gate electrode, the method comprising:
   depositing a first high-k dielectric layer over a first semiconductor region, the first semiconductor region being disposed between a first source/drain region and a second source/drain region;
   performing a first annealing process on the first high-k dielectric layer to increase a crystallinity percentage of the first high-k dielectric layer;
   depositing a second high-k dielectric layer over the first high-k dielectric layer, wherein a thickness of the second high-k dielectric layer is smaller than a thickness of the first high-k dielectric layer; and
   performing a second annealing process on the first high-k dielectric layer and the second high-k dielectric layer to increase a crystallinity percentage of the second high-k dielectric layer, and to further increase the crystallinity percentage of the first high-k dielectric layer.

17. The method of claim 16, wherein after the second annealing process the combined crystallinity of the first high-k dielectric layer and the second high-k dielectric layer is higher than 70 percent.

18. The method of claim 16, further comprising:
   depositing a first capping layer over the first high-k dielectric layer; and
   after depositing the first capping layer, performing a third annealing process, wherein an anneal temperature during the third annealing process is in a range from 500° C. to 950° C.

19. The method of claim 18, wherein during the first annealing process and the second annealing process the temperature is ramped up to a maximum temperature that is in a range from 1000° C. to 1150° C.

20. The method of claim 18, wherein the first capping layer comprises an oxide of a dopant.

* * * * *